(12) United States Patent
Bolis

(10) Patent No.: US 8,124,439 B2
(45) Date of Patent: Feb. 28, 2012

(54) METHOD FOR MAKING AN OPTICAL DEVICE WITH INTEGRATED OPTOELECTRONIC COMPONENTS

(75) Inventor: Sebastien Bolis, Crolles (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 12/992,714

(22) PCT Filed: May 19, 2009

(86) PCT No.: PCT/EP2009/056040
§ 371 (c)(1),
(2), (4) Date: Nov. 15, 2010

(87) PCT Pub. No.: WO2009/141327
PCT Pub. Date: Nov. 26, 2009

(65) Prior Publication Data
US 2011/0086461 A1    Apr. 14, 2011

(30) Foreign Application Priority Data

May 21, 2008 (FR) ...................... 08 53293

(51) Int. Cl.
*H01L 21/00* (2006.01)
*H01L 21/46* (2006.01)
*H01L 21/44* (2006.01)

(52) U.S. Cl. .......... 438/65; 438/456; 438/458; 438/459; 438/69; 438/75; 438/98; 438/667; 257/E31.127

(58) Field of Classification Search ..................... 438/65, 438/456, 458, 459, 69, 75, 98, 667; 257/E31.127
See application file for complete search history.

(56) References Cited

U.S. PATENT DOCUMENTS

| | | | |
|---|---|---|---|
| 5,604,160 | A | 2/1997 | Warfield |
| 5,798,557 | A | 8/1998 | Salatino et al. |
| 5,915,168 | A * | 6/1999 | Salatino et al. ............... 438/110 |
| 6,285,064 | B1 | 9/2001 | Foster |
| 6,607,941 | B2 | 8/2003 | Prabhu et al. |
| 6,669,803 | B1 | 12/2003 | Kathman et al. |

(Continued)

FOREIGN PATENT DOCUMENTS

| | | |
|---|---|---|
| EP | 1 772 908 A2 | 4/2007 |
| EP | 1 772 908 A3 | 4/2007 |

(Continued)

OTHER PUBLICATIONS

French Preliminary Search Report issued Feb. 2, 2009, in Patent Application No. 0853293.

*Primary Examiner* — Kevin Parendo
(74) *Attorney, Agent, or Firm* — Oblon, Spivak, McClelland, Maier & Neustadt, L.L.P.

(57) ABSTRACT

A method for making an optical device with integrated optoelectronic components, including a) making a protective structure including a support in which at least one blind hole is made, an optical element being positioned in the blind hole, b) attaching the support to a substrate including the integrated optoelectronic components, the blind hole forming a cavity in which the optical element faces one of the optoelectronic components, c) achieving thinning of the substrate and making electric connections through the substrate, and d) making an aperture through the bottom wall of the blind hole, uncovering at least one portion of the optical field of the optical element.

33 Claims, 16 Drawing Sheets

U.S. PATENT DOCUMENTS

Figure 1A:
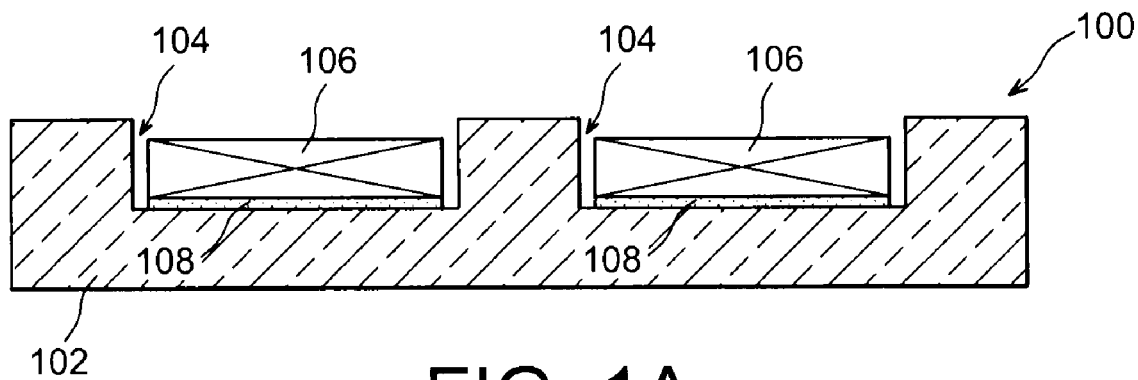

| | | |
|---|---|---|
| 7,144,745 B2 | 12/2006 | Badehi |
| 7,223,626 B2 | 5/2007 | Farnworth et al. |
| 2003/0011889 A1 | 1/2003 | Harden et al. |
| 2004/0184134 A1* | 9/2004 | Makigaki ............... 359/290 |
| 2005/0184219 A1 | 8/2005 | Kirby |
| 2005/0275750 A1* | 12/2005 | Akram et al. ............ 348/374 |
| 2006/0035415 A1 | 2/2006 | Wood et al. |
| 2006/0043262 A1 | 3/2006 | Akram |
| 2006/0044450 A1 | 3/2006 | Wolterink et al. |
| 2007/0148807 A1 | 6/2007 | Akram |
| 2007/0187789 A1 | 8/2007 | Kathman et al. |
| 2007/0275505 A1 | 11/2007 | Wolterink et al. |
| 2008/0023739 A1 | 1/2008 | Hernandez |
| 2008/0293179 A1 | 11/2008 | Akram |
| 2011/0097909 A1 | 4/2011 | Bolis et al. |

FOREIGN PATENT DOCUMENTS

| | | |
|---|---|---|
| EP | 1 811 772 A2 | 7/2007 |
| FR | 2 851 496 | 8/2004 |
| FR | 2 904 144 | 1/2008 |
| WO | WO 2004/027880 A2 | 4/2004 |
| WO | WO 2004/027880 A3 | 4/2004 |
| WO | WO 2008/011003 A2 | 1/2008 |
| WO | WO 2008/011003 A3 | 1/2008 |

* cited by examiner

METHOD FOR MAKING AN OPTICAL DEVICE WITH INTEGRATED OPTOELECTRONIC COMPONENTS

TECHNICAL FIELD

The invention relates to a method for making an optical device with integrated optoelectronic components including a structure ("waferlevel packaging") for protecting the integrated optoelectronic components, for example CMOS ("Complementary Metal Oxide Semiconductor") or CCD ("Charge Coupled Device") imagers.

The invention applies to any type of imagers, regardless of the detection wavelength range of these imagers (visible, infrared range, etc.). The optical device made may advantageously be a camera with integrated imagers.

STATE OF THE PRIOR ART

In the field of structures for protecting substrates with integrated imagers, a known mechanical handle system is used when such a substrate has to be thinned to a small thickness and be optionally subject to other technological operations. By small thickness is understood a thickness below which the substrate no longer has sufficient mechanical strength for guaranteeing its handling without any risk of damage, for achieving its automatic loading in equipment and allowing technological operations to be carried out at the scale of the substrate without such a mechanical handle. Such a thickness described as a small thickness may be comprised between about 300 µm and a few micrometers.

When such a mechanical handle is used for a substrate including integrated imagers, this handle is typically made with a glass-based substrate which is transferred onto the substrate including the imagers.

The use of such a mechanical handle however has drawbacks. Indeed, given that the heat expansion coefficient (HEC) of glass, which for example is equal to 3.3 m/m/K for Borofloat glass, is different from that of silicon (typically equal to 2.6 m/m/K), the structure formed by the mechanical handle and the substrate after adhesive bonding has deformation which may be a problem not only for automatic handling of the substrate but also for the quality of the operations which this structure should subsequently undergo. This deformation is all the more a problem since the size of the substrates is large (for example in the case of a 12-inch wafer). Further, in the perspective of adding functions to the glass substrate, it may be advantageous to use glasses with a larger heat expansion coefficient, causing a still larger deformation of the structure. The problem detailed above related to the deformation of the formed structure then becomes very rapidly limiting and blocking.

When such a handle is adhesively bonded to a substrate including imagers, the structure formed by the substrate and the mechanical handle is cut out, after performing various technological operations on the substrate, in order to form independent elements each including one imager, each element then being transferred into a camera module comprising other optical elements.

It is also known how to make a camera module including a structure for protecting a substrate, called an interposer, making an interface between the substrate and optical elements (for example a simple glass plate or an assembly including one or more lenses). Such an interposer is positioned on the substrate including the imagers and with which the optical elements may be positioned at a specific distance relatively to the pixel plane, i.e. the plane from which light detection is performed by the imagers, and a cavity of air or of a controlled atmosphere may be formed above the pixel plane in order to optimize the optical performances of the camera module.

The benefit of such an interposer is to be able to control at the scale of the substrate, the optical element/imager distance and to thereby do without the focusing operation of the camera modules which do not include such interposers, consisting of placing the pixel plane of the imager in the focal plane of the optical element, which is a costly operation.

Document U.S. Pat. No. 7,223,626 B2 describes an interposer forming a matrix comprising a polymerized material including recesses, these recesses being intended to be positioned above the imagers integrated to a substrate. After the interposer is positioned on the substrate including the imagers, a glass substrate is transferred onto the interposer. With this interposer, it is possible to obtain accurate positioning of the glass substrate relatively to the substrate with imagers.

The use of such an interposer notably has the drawback that the mechanical reference for the transfer of optical elements other than the glass substrate intended to be optically coupled with the imagers is the upper face of the glass substrate, i.e. the face opposite to the one in contact with the interposer. Thus, the control of the distance between these other optical elements and the imagers requires control of a rather complex chain of dimensions. Indeed, the control of the position of the mechanical reference relatively to the imagers involves the control of the thickness of the interposer, of the thickness of the glass substrate and of the thicknesses of the different adhesive joints between these elements. This chain of dimensions therefore represents a source of significant potential errors.

Further, the heat expansion coefficients of the constitutive materials of this structure (epoxy, polyimide, etc.) strongly differ from that of silicon (material of the substrate including the imagers). If technological operations of the waferlevel type (CVD, PVD depositions, etc.) are contemplated, the resulting deformation of the adhesive bond of the assembly may then become a problem.

Documents US 2006/035415 A1 and US 2006/043262 A1 describe openworked interposers receiving different optical elements in their apertures. Such interposers are used during the final operations for packaging the imagers since they cannot be used as a mechanical handle. Further, with such interposers, it is not possible to achieve thinning of the substrate while guaranteeing to the thereby formed assembly a handling facility and compatibility with standard methods carried out at the scale of the substrate. The technological operations to be performed on the devices, and more particularly on the substrates with imagers including these interposers, are delicate because of the openworked structuration of the interposers and of the heterogeneity of the face opposite to the image plane which embrittle the devices and complicate the holding of the substrate by suction and possibly the heating of the substrate with imagers during subsequent technological steps. Finally, given that many elements are used for making the device, the chain of dimensions to be controlled is also complex in order to properly position an additional optical element with respect to an imager.

Document U.S. Pat. No. 7,144,745 B2 describes a mixed structure which may be used both as an interposer and a mechanical handle. But there again, this structure has the drawback that the mechanical reference for the transfer of optical elements is the upper face of a glass substrate, involving control of a complex chain of dimensions. Further, the heat expansion coefficient of the materials used differs from that of silicon from which the substrate with imagers is made, involving problematical deformations of the device including this structure.

DISCUSSION OF THE INVENTION

An object of the present invention is to propose a method for making an optical device not including the drawbacks of the prior art, i.e. resorting to a protective structure fulfilling both the roles of an interposer and of a mechanical handle during technological operations performed on a substrate including integrated optoelectronic components, not posing any heat expansion problems between the protective structure and the substrate including the imagers and not involving any complex chain of dimensions upon possible addition of additional optical elements.

For this, a method for making an optical device with integrated optoelectronic components is proposed, including at least the steps of:

a) making a protective structure comprising at least one support in which is made at least one blind hole, at least one optical element being positioned in the blind hole and firmly attached to at least one wall of the blind hole, b) firmly attaching the support to a substrate comprising the integrated optoelectronic components, the blind hole forming a cavity in which the optical element faces one of the optoelectronic components, c) making electric connections through the substrate and/or between the substrate and the support and/or through the support, and/or achieving thinning of the substrate and/or of the support, d) making at least one aperture through the bottom wall of the blind hole, exposing at least one part of the optical element or uncovering at least one part of the optical field of the optical element.

Step c) may include the achievement of thinning of the substrate and the making of electric connections through the substrate.

In this case, the step c) may further include the making of electric connections between the substrate and the support and/or through the support, and/or the achievement of thinning of the support.

Thus, the protective structure fulfils both the function of an interposer, i.e. it allows the distance between the optical element and the substrate to be controlled, and the function of a mechanical handle, and it does not have the drawbacks of the structures of the prior art (complex chain of dimensions, deformations due to different heat expansion coefficients, difficulties in performing subsequent technological operations).

During the operations performed during step c) of the method, the surface of the structure opposite relatively to the image plane, forming the bottom wall of the blind hole, is not openworked. It is therefore possible to handle the optical device in order to perform various technological operations during step c) (thinning, deposition, lithography, etching, making intraconnections, etc.) by using the protective structure as a mechanical handle.

Further, by making the support of the protective structure from one or several materials for which the heat expansion coefficient is close to that of the material of the substrate, the heat expansion coefficient of the optical element no longer involves any deformation in the optical device given that the latter is not in direct contact with the substrate. It is therefore possible to use in the protective structure, optical elements comprising glass with a larger heat expansion coefficient and/or to contemplate increasing the geometry of the substrates, i.e. use a substrate of larger dimensions.

When, for reasons of optical performances, the distance between the optical element and one of the integrated optoelectronic components has to be small, it is possible to have a mechanical reference, formed by a rear face of the support of the protective structure (this rear face being the face opposite to the one firmly attached to the substrate), which is away from the pixel plane and/or from the optical element since the thickness of the support is independent of the depth of the blind hole made.

The use of such a protective structure excludes the uncertainty on the thickness of the optical element in controlling the distance between the optical element and the substrate. This also applies in the case when other optical elements are subsequently transferred onto the protective structure, given that this structure requires the control of less dimensions than the structures of the prior art which integrate the thickness of the optical element in their chain of dimensions.

Finally, with this method it is possible to make electric connections through the substrate and/or between the substrate and the support and/or through the support without any problems for handling the device by means of the protective structure used as a mechanical handle.

The mechanical handle function may for example be fulfilled by the support and/or the protective structure when the support and/or the protective structure has a thickness greater than or equal to about 300 µm, for example between about 300 µm and 500 µm. It is notably possible that the thickness of the support be equal to or greater than about 300 µm, or comprised between about 300 µm and 500 µm after achieving thinning of the support. The substrate may then also fulfill the function of a mechanical handle during thinning of the support, the thinning of the substrate may in this case be achieved after thinning the support. Before its thinning, the thickness of the substrate may be greater than or equal to about 300 µm, or comprised between about 300 µm and 500 µm.

Several optical elements may be positioned in a single blind hole of the support.

The optical element may be firmly attached to the bottom wall of the blind hole and/or with the walls of the blind hole other than the bottom wall by at least one adhesive bonding interface.

The optical element may comprise glass and/or an organic material (notably for imagers operating in the visible domain) and/or germanium (for infrared detectors for example). The optical element may include at least one plate with parallel faces and/or a lens and/or a lens with an index gradient.

The support may include a substantially planar rear face, opposite to a face intended to be firmly attached to the substrate. Such a planar face is particularly advantageous for performing technological operations during step c) or after step d) of the method, for example in order to make deposits of materials or of optical elements on this rear face.

The integrated optoelectronic components may include CMOS and/or CCD imagers. The invention is particularly suitable for a substrate with integrated CMOS imagers.

The support may comprise a material having a heat expansion coefficient substantially similar to that of the material of the substrate.

Thus, depending on the nature of the material of the support, the latter may have a heat expansion coefficient compatible with that of the substrate, thanks to the fact that the optical function is fulfilled by the optical element and that the mechanical handle function is fulfilled by the support which is distinct from the optical element.

Finally, when the support comprises a material similar to that of the substrate, cutting-out of the assembly formed by the protective structure and the substrate is facilitated since this cutting-out is only achieved in the support, for example comprising a semiconductor, and not in the optical element for example comprising glass, like in the devices of the prior art resorting to a glass substrate for making the optical element.

The support may, during step b) of the method, be firmly attached to the substrate via spacer elements.

Moreover, the thickness of the optical element and the depth of the hole may be selected so that when this support is firmly attached to the substrate, the cavity present between the optical element and the integrated optoelectronic may be filled with a particular fluid (a gas or a liquid) if need be. With this cavity, it is also possible that only the support of the protective structure is in contact with the substrate. The material of the support may therefore be selected in order to avoid problems of heat expansion.

Step d) may correspond to the application of thinning of the support with stopping on the optical element.

Step a) for making the protective structure may correspond to the application of the following steps:
  firmly attaching a first layer, for example comprising at least one semiconductor, glass, LCP ("Liquid Crystal Polymer"), ceramic, an organic material or further metal, to a second layer comprising the material of the optical element,
  etching the second layer, at least one remaining portion of the second layer forming the optical element,
  firmly attaching a third layer, for example comprising at least one semiconductor, to a fourth layer, for example comprising at least one material similar to that of the substrate including the optoelectronic components,
  etching at least one hole through the fourth layer,
  firmly attaching remaining portions of the fourth layer against a face of the first layer, the optical element being positioned in the hole etched through the fourth layer,
  removing the third layer.

Step a) for making the protective structure may correspond to the application of the following steps:
  making a first stack including a first mechanical layer, for example comprising at least one semiconductor, glass, LCP ("Liquid Crystal Polymer"), ceramic, an organic material or further metal, and a second layer comprising at least one material forming the optical element,
  etching the second layer, at least one remaining portion of the second layer forming the optical element,
  making a second stack including a third layer, for example comprising at least one semiconductor, and a fourth layer, for example comprising at least one material similar to the one of the substrate including the optoelectronic components,
  etching at least one hole through the fourth layer,
  firmly attaching the first and second stacks, remaining portions of the fourth layer being positioned against a face of the first layer, the optical element being positioned in the hole etched through the fourth layer,
  removing the third layer.

The removal of the third layer may be obtained by a step for totally thinning the third layer or detaching the third layer when the latter is firmly attached by temporary adhesive bonding to the fourth layer.

In one alternative, the step a) for making the protective structure may correspond to the application of the following steps:
  achieving temporary adhesive bonding between a first layer, for example comprising at least one semiconductor, glass, LCP, ceramic, an organic material or further metal, and a second layer comprising the material of the optical element,
  etching the second layer, at least one remaining portion of the second layer forming the optical element,
  depositing an adhesive bonding interface at least on the optical element,
  firmly attaching a third layer, for example comprising at least one material similar to that of the substrate including the optoelectronic components to a fourth layer, for example comprising at least one semiconductor,
  etching at least one hole through the fourth layer,
  firmly attaching the third layer to the adhesive bonding interface, the optical element being positioned in the hole etched through the fourth layer,
  removing the first layer.

In one alternative, the step a) for making the protective structure may correspond to the application of the following steps:
  making a first stack including a first layer, for example comprising at least one semiconductor, glass, LCP, ceramic, an organic material or further metal, and a second layer comprising at least one material forming the optical element,
  etching the second layer, at least one remaining portion of the second layer forming the optical element,
  depositing an adhesive bonding interface at least on the optical element,
  making a second stack including a third mechanical layer, for example comprising at least one material similar to the one of the substrate including the optoelectronic components, and a fourth layer, for example comprising at least one semiconductor,
  etching at least one hole through the fourth layer,
  firmly attaching the first and second stacks, the third layer being positioned against the adhesive bonding interface, the optical element being positioned in the hole etched through the fourth layer,
  removing the first layer.

The transfer of the optical elements into the holes etched through the fourth layer may be accomplished by collective transfer of the whole of the optical elements, or individually by detaching beforehand the optical elements from each other, and then by individually transferring them into the etched holes. Individual transfer (a transfer of the "Pick & Place" type) has the advantage of being able to sort out the optical elements and to only transfer the desired optical elements in the etched holes.

The step a) for making the protective structure may include at least the following sub-steps:
  making the support in which the blind hole is made,
  positioning and firmly attaching the optical element in the blind hole via at least one attachment material positioned beforehand at least on a wall of the blind hole and/or on the optical element.

The method may further include, between the step for etching the hole through the fourth layer and the step for firmly attaching the third layer to the adhesive bonding interface, a step for depositing at least one layer at least partly opaque in the range of the operating wavelengths of the optoelectronic component and/or electrically conducting on remaining portions of the fourth layer and against walls of the hole etched through the fourth layer, forming an optical and/or electromagnetic protection of the device.

Generally, the method may further include during step a), the making of an optical and/or electromagnetic protection between the support and the optical element.

The method may further include, between step a) for making the protective structure and step b) for firmly attaching the support to a substrate, a step for depositing at least one layer at least partly opaque in the range of the operating wavelengths of the optoelectronic component and/or electrically conducting on at least one part of the walls of the blind hole and/or at least one part of the surface of the support firmly attached to the substrate, forming an optical and/or electromagnetic protection.

The support may be formed by a single layer, the blind hole may be obtained by etching in this layer.

The method may further include, after step d) for making the aperture, a step for depositing at least one layer, at least partly opaque in the range of the operating wavelengths of the optoelectronic component and/or electrically conducting on the walls of a rear face of the support, opposite to the face of the support firmly attached to the substrate.

The method may further include after step d) for making the aperture, a step for transferring at least one optical stack including at least one optical element onto a rear face of the support, opposite to the face of the support firmly attached to the substrate, in an optical field of the optoelectronic component positioned in the cavity.

The method may further include after the step for transferring the optical stack, the making of electric connections between the optical elements of the optical stack and/or of the protective structure and/or of the optoelectronic components.

The method may further include the making of an optical and/or electromagnetic protection on the optical stack.

In this case, the method may further include, after making the optical and/or electromagnetic protection, a step for making at least one aperture in said optical and/or electromagnetic protection in the optical field of the optoelectronic components.

SHORT DESCRIPTION OF THE DRAWINGS

Figure 1B:
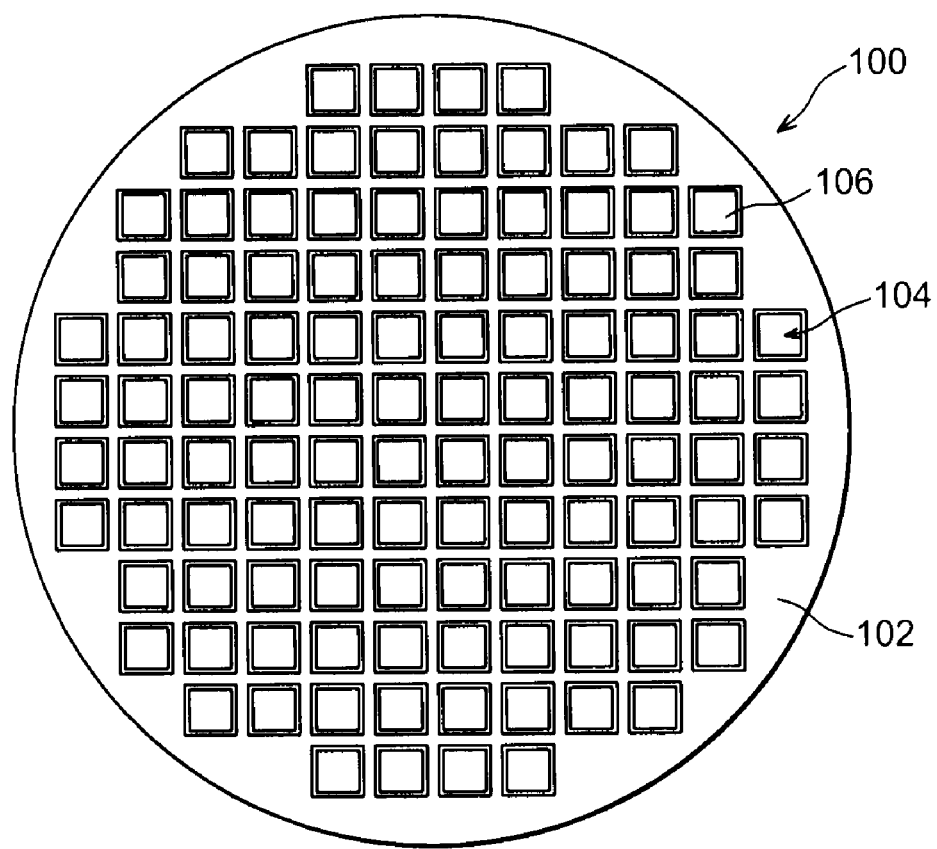
Figure 1C:
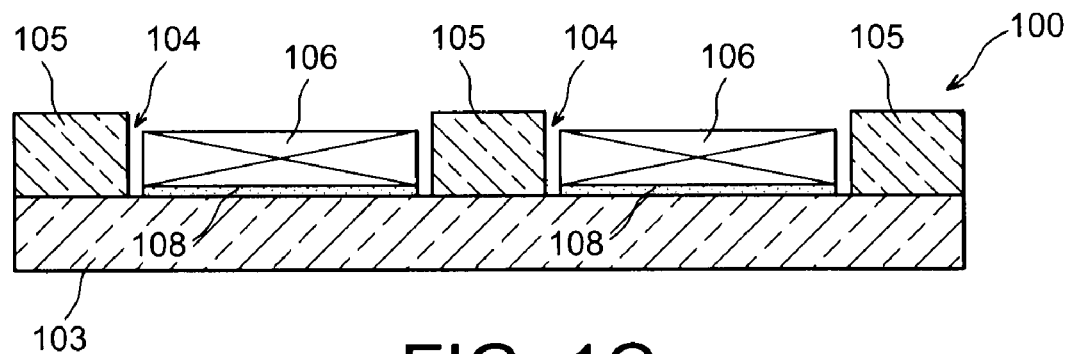
Figure 2:
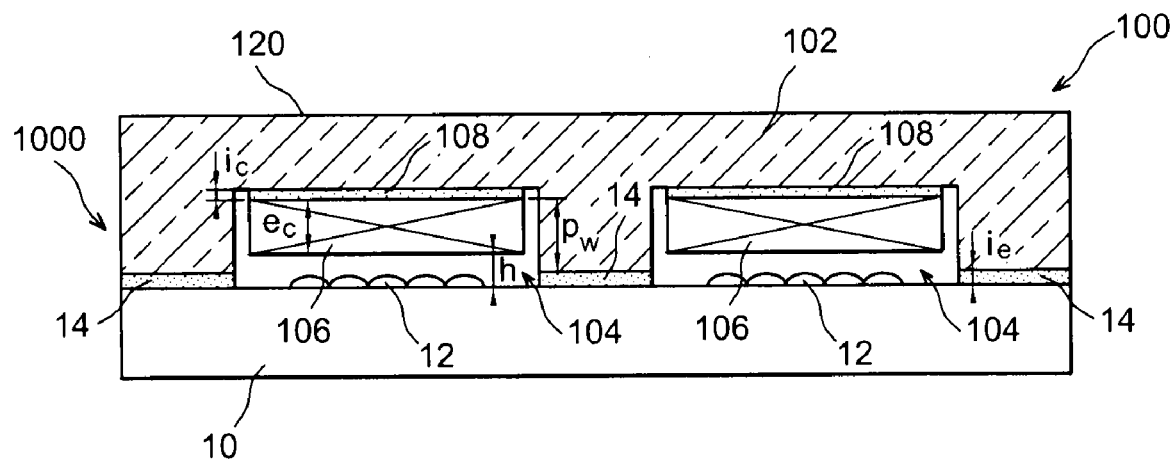
Figure 3:
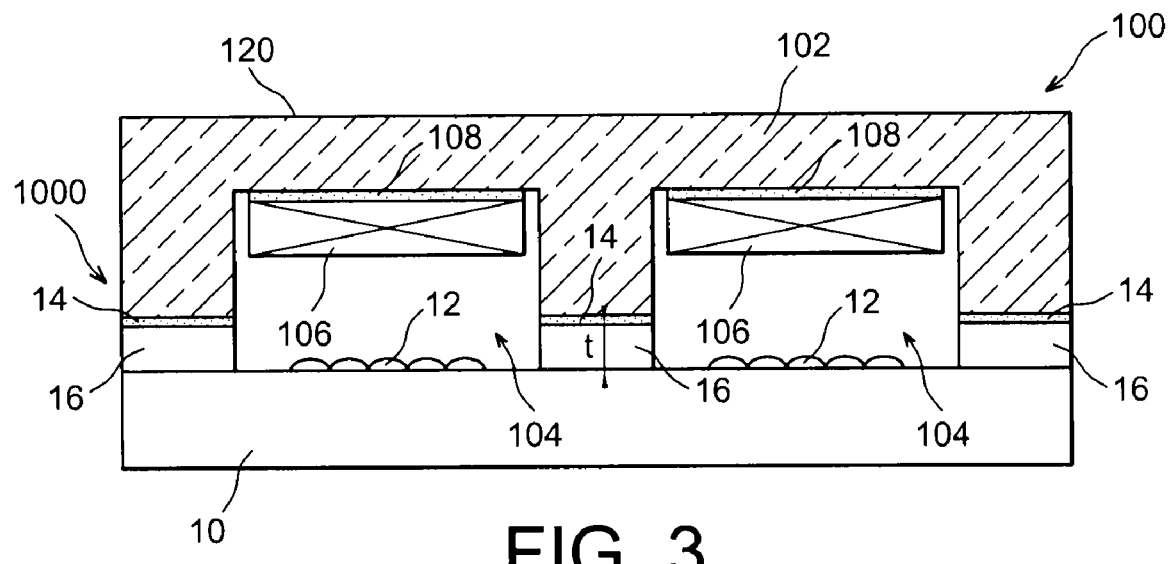
Figure 4:
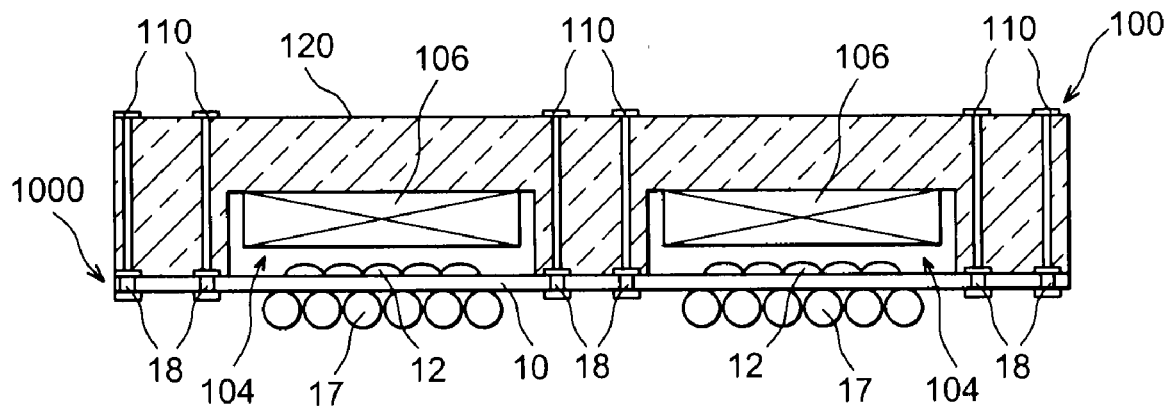
Figure 5A:
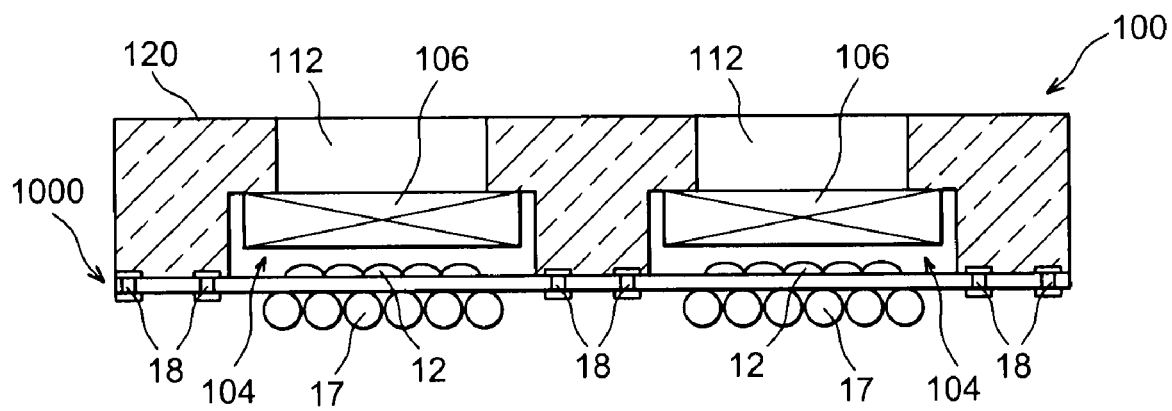
Figure 5B:
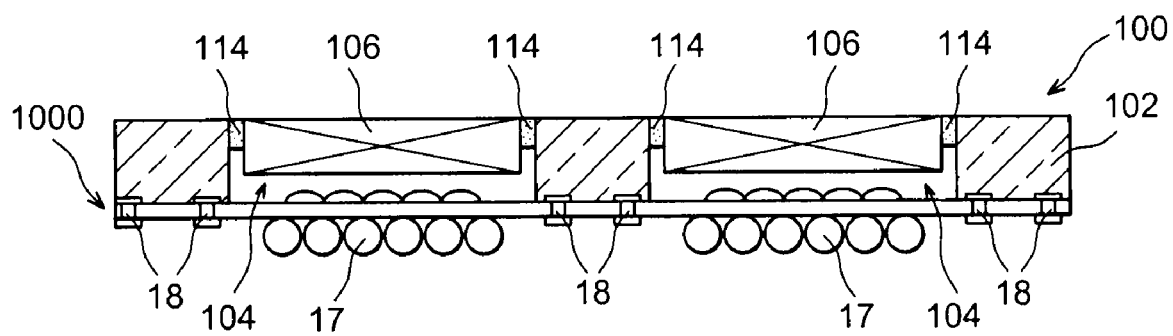
Figure 6A:
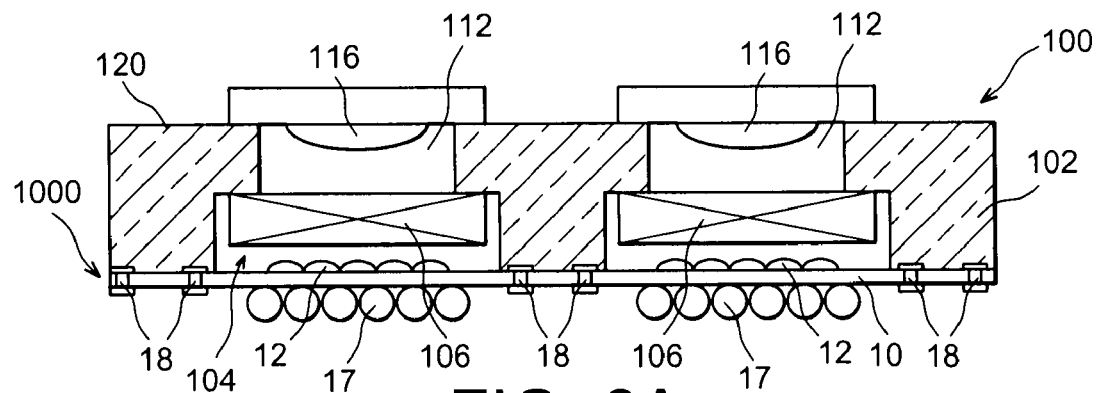
Figure 6B:
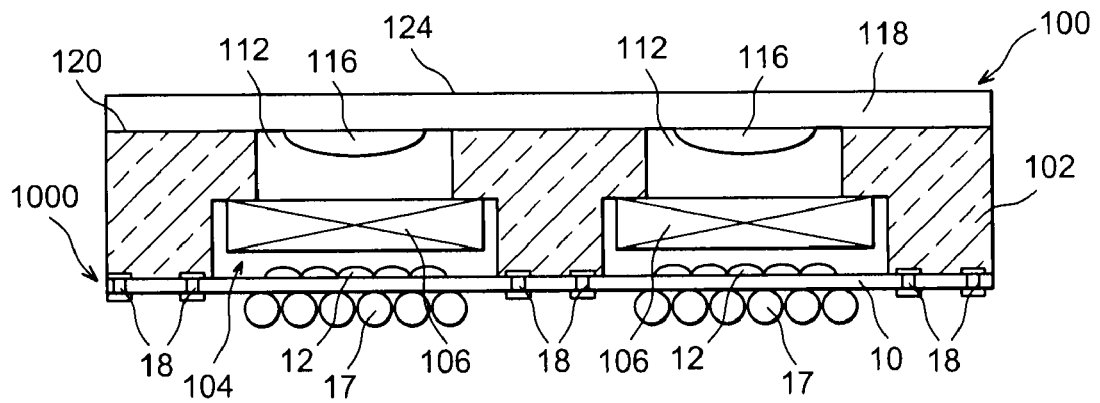
Figure 6C:
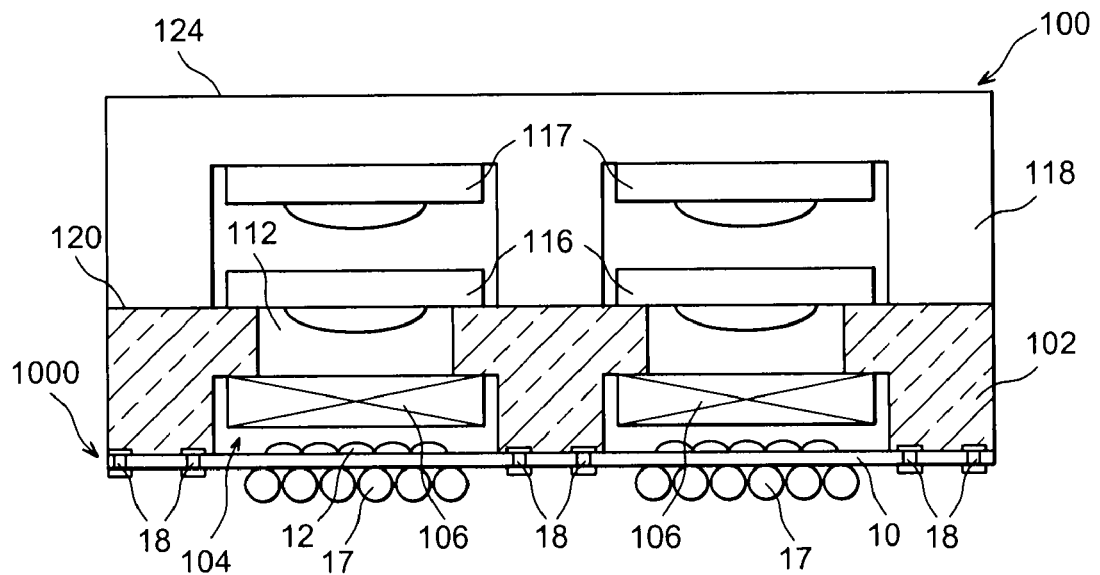
Figure 7A:
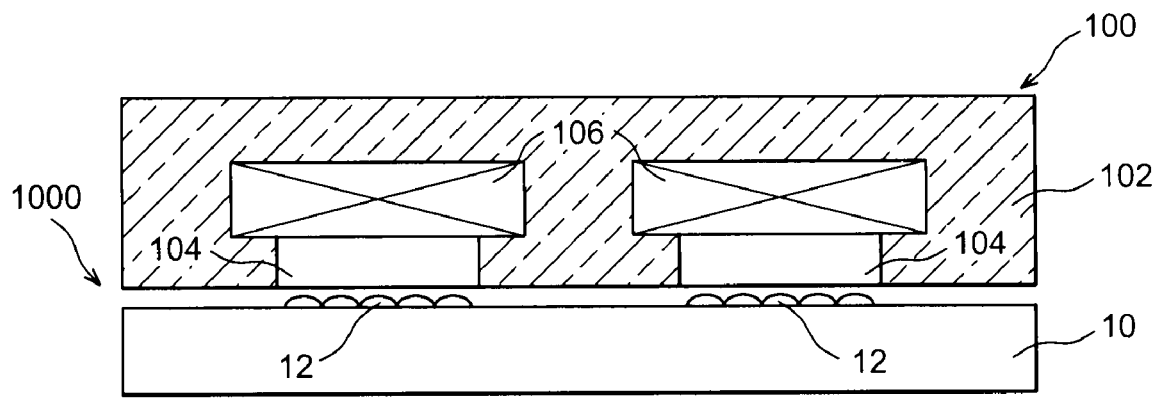
Figure 7B:
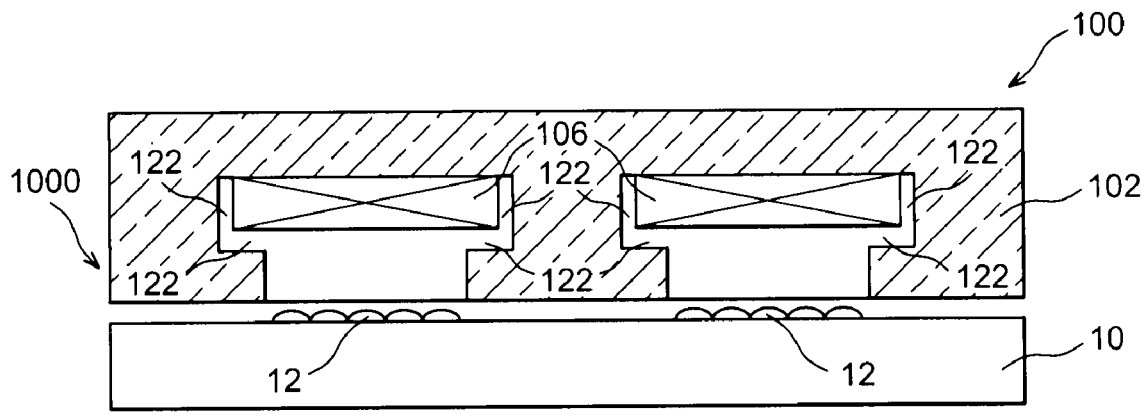
Figure 7C:
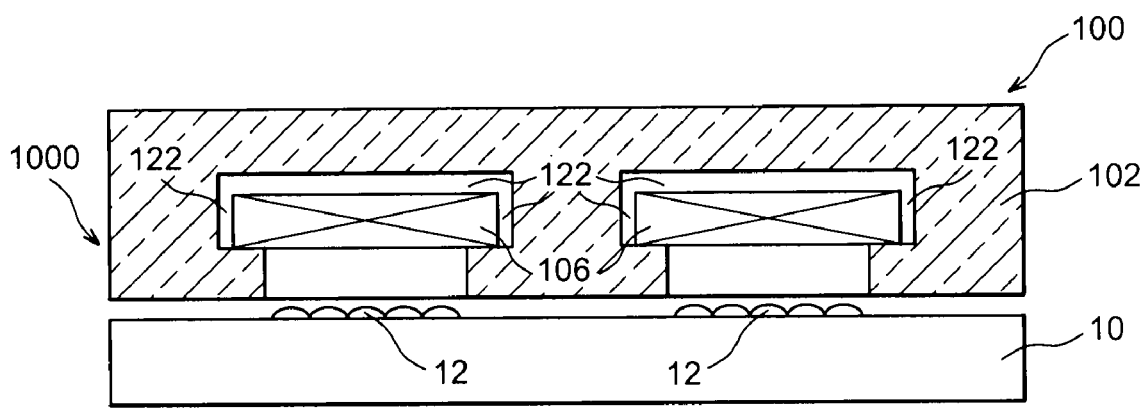

The present invention will be better understood upon reading the description of exemplary embodiments given purely as an indication and by no means as a limitation with reference to the appended drawings wherein:

FIGS. 1A and 1B respectively represent a partial sectional view and a top view of a protective structure made during a method for making an optical device, subject matter of the present invention, according to a first exemplary embodiment, FIG. 1C represents a partial sectional view of a protective structure made during a method for making an optical device, subject matter of the present invention, according to a second exemplary embodiment, FIG. 2 illustrates a partial sectional view of an optical device obtained by applying a making method, subject matter of the present invention, according to a first embodiment, FIG. 3 illustrates a partial sectional view of an optical device obtained by application of a making method, subject matter of the present invention, according to an alternative of the first embodiment, FIG. 4 illustrates a partial sectional view of an optical device obtained by applying a making method, subject matter of the present invention, according to the first embodiment, FIGS. 5A, 5B and 6A-6C illustrate partial sectional views of optical devices obtained by applying making methods, subject matters of the present invention, according to alternatives of the first embodiment, FIGS. 7A-7C illustrate partial sectional views of an optical device obtained by applying making methods, subject matter of the present invention, according to other embodiments, FIGS. 8A-8G illustrate steps for making a protective structure made during a method for making an optical device, subject matter of the present invention according to a particular embodiment, FIGS. 9A-9F illustrate steps for making a protective structure made during a method for making an optical device, subject matter of the present invention, according to another particular embodiment, FIGS. 10A-10K illustrate steps of a method for making an optical device, subject matter of the present invention, according to another particular embodiment.

Identical, similar or equivalent portions of the different figures described hereafter bear the same numerical references so as to facilitate switching from one figure to the other.

The different portions illustrated in the figures are not necessarily illustrated according to a uniform scale, in order to make the figures more legible.

The different possibilities (alternatives and embodiments) have to be understood as not being exclusive of each other and they may be combined together.

DETAILED DISCUSSION OF PARTICULAR EMBODIMENTS

First of all, reference will be made to FIGS. 1A and 1B which illustrate a partial sectional view and a top view of a protective structure 100, respectively, made during a method for making an optical device with integrated optoelectronic components, according to a first exemplary embodiment.

The structure 100 includes a layer 102 in which blind holes 104 are made. In the example of FIGS. 1A and 1B, two blind holes 104 are illustrated and an optical element 106 is firmly attached by adhesive bonding in each hole 104. An adhesive bonding interface 108 between each optical element 106 and the bottom wall of each hole 104 is illustrated in FIG. 1A. In the example of FIGS. 1A and 1B, only a part of the hole 104 and of the optical element 106 of the structure 100 is illustrated. The structure 100 may include as many blind holes and optical elements as there are optoelectronic components, for example imagers here, integrated into a substrate which the structure 100 is intended to protect. This substrate may for example include more than 1,000 imagers, this number being notably a function of the resolution of the imagers and of the technology used.

The holes 104 may be made by lithography and DRIE (deep reactive ionic etching), molding, wet etching, sawing, laser cutting, hot pressing, stamping or further by micromachining (for example sanding).

The optical elements 106 are transparent in the range of the operating wavelengths of the imagers of the optical device. Typically, the optical elements 106 may comprise glass and/or organic materials (for example for imagers operating in the range of visible wavelengths) and/or germanium (for imagers operating in the infrared range). The optical elements 106 may be plates with parallel faces consisting of optically homogeneous material or may be of a geometry with which particular optical functionalities may be achieved (filtering, magnification, etc.) in order to improve the performances of the corresponding imager. The optical elements 106 may for example be lenses.

In this exemplary embodiment, the layer 102 advantageously comprises the same material as the one making up the substrate including the imagers intended to be protected by the structure 100, for example semiconductor such as silicon and/or comprises LCP. It is also possible that the layer 102 comprises ceramic, organic materials or further metal, without this being a penalty for the thermomechanical behavior of the assembly formed by the structure 100 and the substrate with imagers after assembly. The material of the layer 102 may notably be selected depending on the material of the substrate so that these materials have substantially similar heat expansion coefficients.

In the exemplary embodiment described in connection with FIGS. 1A and 1B, the layer 102 comprises a single material and the blind holes 104 are formed by etching in the layer 102. A protective structure is therefore available formed from a single monolithic layer. In an alternative embodiment illustrated in FIG. 1C, the layer 102 may be replaced with a support formed by several materials. In this figure, the structure 100 includes a support formed by a first substantially planar layer 103 on which a second structured layer 105 is positioned. Through-holes are formed in the layer 105 in order to form the blind holes 104, the bottom walls of which are formed by the first layer 103 and in which the optical elements 106 are positioned, on the layer 103 via the adhesive bonding interfaces 108. The layer 105 advantageously comprises the same material as the one making up the substrate including the imagers intended to be protected by the structure.

In another alternative, it is possible that the openworked layer 105 be replaced with distinct material portions transferred onto the first layer 103, thereby forming a structure 100 including blind holes 104 in which the optical elements 106 are positioned. These portions transferred onto the first layer 103 may advantageously comprise the same material as the one making up the substrate including the imagers intended to be protected by the structure 100.

In order to obtain such a structure 100, the first and the second layers 103, 105 may first of all be firmly attached for example by adhesive bonding or lamination. The second layer 105 may also be made on the first layer 103 by PVD, CVD or electrolytic deposition, or by molding and injection-transfer. A structuration of the second layer 105 for forming the holes 104 is for example achieved by deep reactive ionic etching, molding, injection transfer, wet etching, sawing, laser cutting, hot pressing, micro-machining or further co-sintering if the first and the second layer 103, 105 comprise ceramic. When the second layer 105 is made on the first layer 103 by injection-transfer, the structuration of the second layer 105 may in this case be accomplished simultaneously with its achievement. Generally, the structuration of the second layer 105 may be made before, during or after the step for firmly attaching both layers 103 and 105.

Once the structure 100 is made, including the support formed by the layer 102 or both layers 103 and 105, in which the optical elements 106 are positioned, it is transferred onto a substrate 10 including imagers 12 in order to form an optical device 1000, as illustrated in FIG. 2. The transfer technique used may for example be of the adhesive bonding (anodic, molecular, eutectic, organic, etc.) type or of the brazing type for example from gold and tin or from another metal and/or metal alloy. In the example of FIG. 2, an adhesive bonding interface 14 is present between the structure 100 and the substrate 10.

After the transfer of the structure 100 onto the substrate 10, each optical element 106 is found at a distance h from the imager 12 facing said optical element 106. This distance h is the distance between the pixel plane, i.e. here the plane from which light detection is performed by imagers 12, and the optical elements 106. The value of this distance h depends on the thickness $e_C$ of the optical element 106, on the thickness $i_C$ of the adhesive bonding interface 108, on the depth $p_W$ of the holes 104 and on the thickness $i_e$ of the adhesive bonding interface 14. The following relationship therefore holds:

$$h + e_C + i_C = p_W + i_e$$

The values of h, $e_C$ and $i_C$ may vary from one hole to the other of the protective structure 100. The value of $i_e$ is directly related to the selected technique for transferring the structure 100 onto the substrate 10. This dimension $i_e$ and therefore the selection of the transfer technique used, has an influence on the geometry of the optical device 1000. For a desired distance h and a fixed thickness $e_C$ of the optical element, the thicker the adhesive bonding interface 14, the less the depth of the hole 104 is significant.

In the example of FIG. 2, one has $p_W > e_C + i_C$. In an alternative, it would be possible to have $p_W = e_C + i_C$ or further $p_W < e_C + i_C$.

The geometry of the optical device 1000 may also be related to the topology of the substrate 10, notably when the adhesive bonding interface 14 is shifted relatively to the pixel plane by a distance t by means of spacer elements 16 positioned between the substrate 10 and the structure 100, and on which the adhesive bonding interface 14 is formed. An example of such a device is illustrated in FIG. 3. Therefore in this case, the following relationship holds:

$$h + e_C + i_C = p_W + i_e + t$$

In this example, it is also possible to have either $p_W > e_C + i_C$, $p_W = e_C + i_C$ or further $p_W < e_C + i_C$.

Once the structure 100 is assembled to this substrate 10, different technological operations may be formed on the device 1000, as this is illustrated in FIG. 4. For example, it is possible to achieve thinning of the substrate 10. The structure 100 is used as a mechanical handle during this thinning. Electric contacts 17, for example connection microbeads, are also formed on the face of the substrate 10 opposite to the one including the imagers 12.

In FIG. 4, it is also seen that electric connections 18 are made through the substrate 10. With these connections, it is possible to electrically connect both main opposite faces of the substrate 10 and they may be connected to the electric contacts 17. Finally, these electric connections are also raised to the level of a rear face 120 of the layer 102, which is opposite to the face of the layer 102 in contact with the substrate 10, through electric connections 110. Such a rise in the electric contacts of the substrate 10 may be of interest in the case when a device with variable focal length is intended to be subsequently transferred onto the rear face 120 of the layer 102 (autofocus and zoom applications). These intraconnection operations 18 and 110 are performed after assembling the structure 100 to the substrate 10 in order to take advantage of the mechanical handle function fulfilled by the structure 100.

In the examples of FIGS. 2-4, the rear face 120 of the layer 102 is planar. Such a planar rear face notably allows handling of the optical device 1000 with greater ease, for example by means of easier suction of the assembly when it has to be handled. Further, during certain operations, a heating substrate support is sometimes used. With the presence of a planar rear face, it is possible to guarantee better heat exchange between the heating support and the device 1000, this property may be determining for performing different technological operations subsequently to the assembling of the structure 100 to the substrate 10.

When the layer 102, or the first layer 103 in the case of the structure 100 of FIG. 1C for example comprises a material which is not transparent or not sufficiently transparent to the wavelengths emitted by the imagers 12, after assembling the structure 100 to the substrate 10 and for example after having applied the operations using the structure 100 for fulfilling the function of mechanical handling, apertures are made in the layer 102 allowing the bottom of the blind holes 104 to be opened. Such a case is for example illustrated in FIG. 5A. It is seen in this figure that apertures 112 were made in the bottom of the blind holes 104. These apertures 112 are made in the optical field of the element 106 so that the layer 102 does not block these optical fields. These apertures 112 may for example be made by lithography and etching.

These apertures 112 may be made before forming the electric contacts 17 and/or after having completed most of the technological operations performed on the device 1000 (thinning of the substrate 10, making the electric connections 18, 110).

It is also possible to thin the layer 102, from the rear face 120 of the layer 102. This thinning may be combined with the making of the apertures 112. In one alternative, it is also possible to totally thin the layer 102 until the optical elements 106 are reached, as this is illustrated in the example of FIG. 5B. In this alternative, the optical elements 106 are bound to the sidewalls of the holes 104, i.e. the walls which are perpendicular to the bottom walls of the holes 104, through adhesive bonding interfaces 114.

In the case of total thinning as illustrated in FIG. 5B, it is possible to use a structure 100 such as the one illustrated in FIG. 1C, in which the first layer 103 would be temporarily adhered with the second layer 105. After assembling the structure 100 with the substrate 10 and after possibly performing technological steps, the first layer 103 may then be detached from the second layer 105, thereby allowing a device to be obtained, similar to the one illustrated in FIG. 5B.

In one alternative, the optical elements 106 may be integrated into the holes 104 by a method for injecting an organic material, for example LCP, between the optical element 106 and the hole 104, or further by a method for crimping the optical element 106 in the hole 104, thereby avoiding the presence of an adhesive bonding interface between the optical element 106 and one or several walls of the holes 104.

The method for transferring the optical elements 106 into the holes 104 may be of the unit type ("pick & place"), each optical element 106 being then successively placed in the holes 104. This type of transfer method is of interest when the optical elements are globally made at the scale of the substrate. In this case, preliminary sorting-out of the optical elements in order to end up with a substrate not including any faulty optical elements may be performed before assembling the structure 100 to the substrate 10. In an alternative, it is also possible to transfer the optical elements collectively, for example by a transfer of the DBG ("Dicing Before Grinding") type during which the optical elements made collectively are precut and then assembled on the layer 103 (with precutting opposite to the layer 103) in order to be then thinned until singulation of the optical elements.

After assembling the structure 100 and the substrate 10, it is possible to cut out the optical device 1000 at solid areas of the layer 102 or at the portions 105, i.e. between the holes 104. In this way several unit assemblies are formed, each including an imager 12 and an optical element 106. Each of these unit assemblies may be treated independently, and for example be mounted in distinct camera modules. However, from the assembling of the structure 100 and of the substrate 10, it is also possible to completely or partly make the camera modules at the scale of the substrate collectively.

Different optical elements, for example lenses, may be transferred onto the rear face 120 of the layer 102 of the structure 100. On the device 1000 illustrated in FIG. 6A, in which apertures 112 are made in the layer 102 at the optical path of the imagers 12 and of the optical elements 106, unit lenses 116 are positioned on the rear face 120 of the layer 102, at the apertures 112. These lenses 116 may for example be positioned on the layer 102 before the device 1000 is cut out into several independent elements including one or several imagers 12, one or several optical elements 106 and one or several lenses 116. In the example of FIG. 6A, the lenses 116 are inserted into the apertures 112. In an alternative illustrated in FIG. 6B, a substrate 118 including the lenses 116 is transferred over the whole rear face 120 of the layer 102, the lenses 116 being firmly attached to each other via the substrate 118. Other more complex structures may be transferred onto the substrate 102, such as for example the one illustrated in FIG. 6C, including a substrate 118 in which holes are made including several levels of lenses 116, 117 (two levels in the example of FIG. 6C). The example of FIG. 6C corresponds to the example illustrated in FIG. 6A including an additional protective structure 118, for example similar to a structure 100 described earlier. In the examples illustrated in FIGS. 6B and 6C, in which a substrate 118 is used, it is possible to raise the electric contacts from the substrate 10 up to a rear face 124 of the substrate 118. Such an operation may be performed before opening the substrate 118 at the lenses 116, 117, and the transfer of one or several other optical elements in the optical field of the imagers 12, onto the rear face 124 of the substrate 118.

Generally, the geometry of the structure 100 may be different from those described in the previous examples. As illustrated in FIG. 7A, it is possible to have optical elements 106 fitted to the dimensions of the holes 104, and the holes 104 of which have optical apertures to the imagers 12 with smaller dimensions than those of the optical elements 106. FIGS. 7B and 7C illustrate alternatives of the configuration illustrated in FIG. 7A, in which empty spaces 122 are present between the walls of the holes 104 and the optical elements 106.

Reference is now made to FIGS. 8A-8G which illustrate the steps for making a protective structure 100 of an optical device 1000 with integrated optoelectronic components, for example similar to the structure 100 illustrated in FIG. 1C.

Figure 8A:
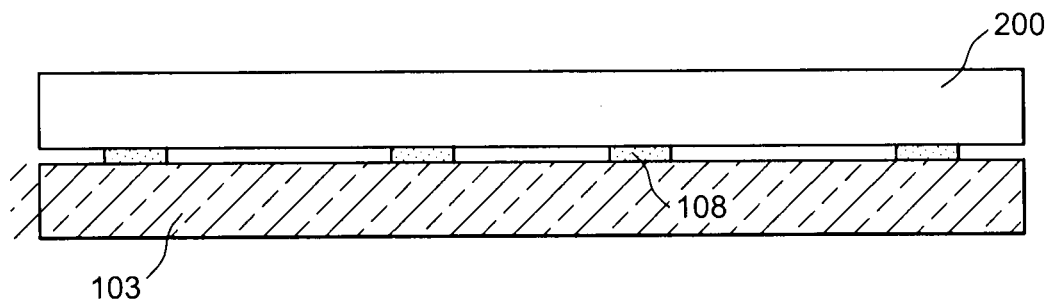

As illustrated in FIG. 8A, in order to make the optical elements 106, adhesive bonding of a second layer 200, here comprising glass, is achieved on a first layer of silicon 103. Any type of adhesive bonding may be used (anodic, molecular, eutectic, organic). In the example of FIG. 8A, an organic adhesive bonding with photosensitive resin portions, forming adhesive bonding interfaces 108, is achieved.

Figure 8B:
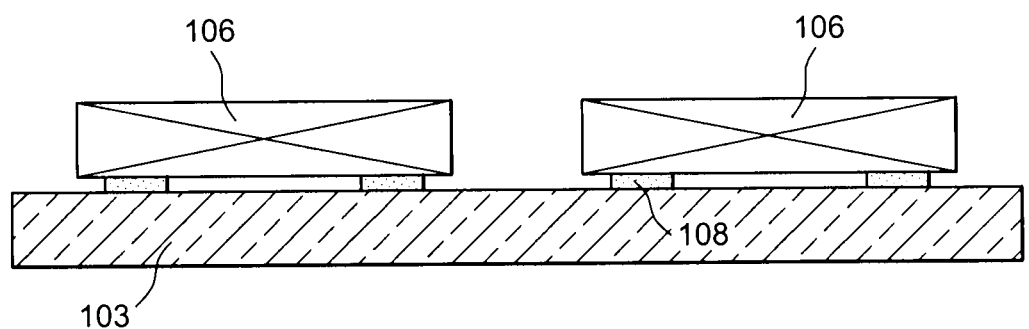

Cutting-out or etching of the second layer 200 is then performed in order to form the optical elements 106 according to the desired dimensions (FIG. 8B). This step may optionally be carried out in several cutting steps.

Concurrently with the making of the optical elements 106, the second part of the structure 100 is made, which will allow formation of the second openworked layer 105.

Figure 8C:
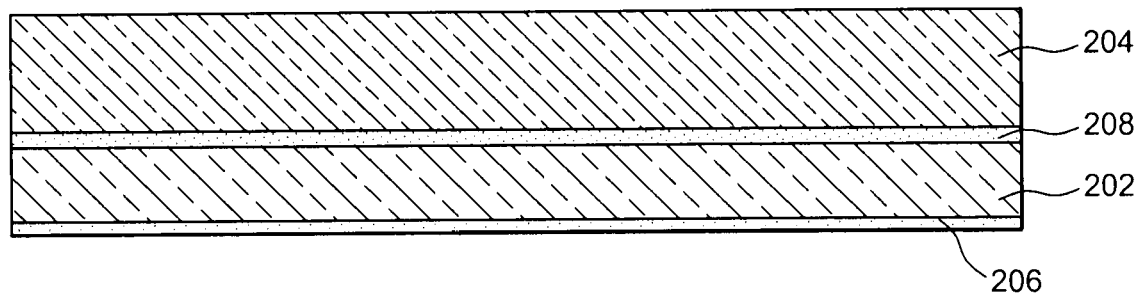

As illustrated in FIG. 8C, the first semiconductor layer 202, for example in silicon, is adhesively bonded to a second semiconductor layer 204 also in silicon in this example. In this exemplary embodiment, the first layer 202 includes oxidized faces, forming $SiO_2$ layers 206, 208, with which silicon/$SiO_2$ molecular bonding may be achieved, firmly attaching both layers 202, 204. It is also possible that the second layer 204 is the one which includes oxidized faces and not the first layer 202, also allowing silicon/$SiO_2$ molecular bonding to be achieved, firmly attaching both layers 202, 204.

Figure 8D:
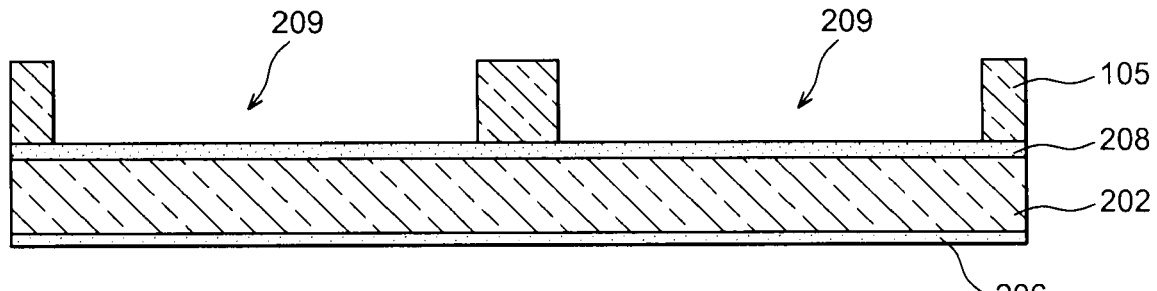
Figure 8E:
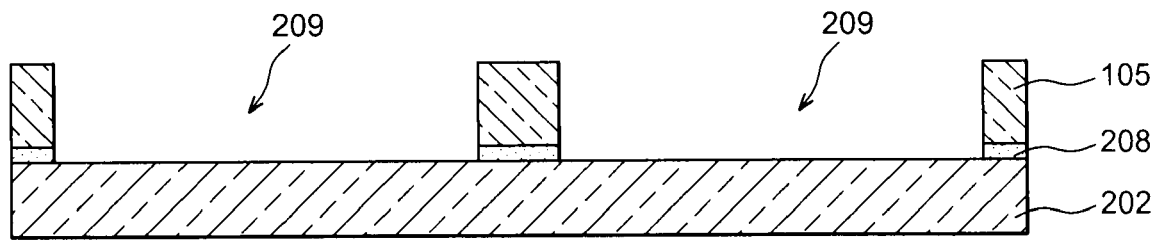

In FIG. 8D, lithography and hole-etching steps 209 are then performed in the second layer 204 with stopping on the SiO$_2$ layer 208, the remaining portions thereby forming the second structured layer 105 intended to be transferred onto the layer 103. In an alternative, at least one additional thin layer interposed between both layers 202, 204 may also act as a layer for stopping etching. Next, etching of the dielectric present on the structure is performed, i.e. the portions of the SiO$_2$ dielectric layer 208 not covered by the second structured layer 105 and the SiO$_2$ layer 206, for example wet etching with a HF solution (FIG. 8E). In an alternative, it is also possible not to etch the dielectric present on the structure.

Figure 8F:
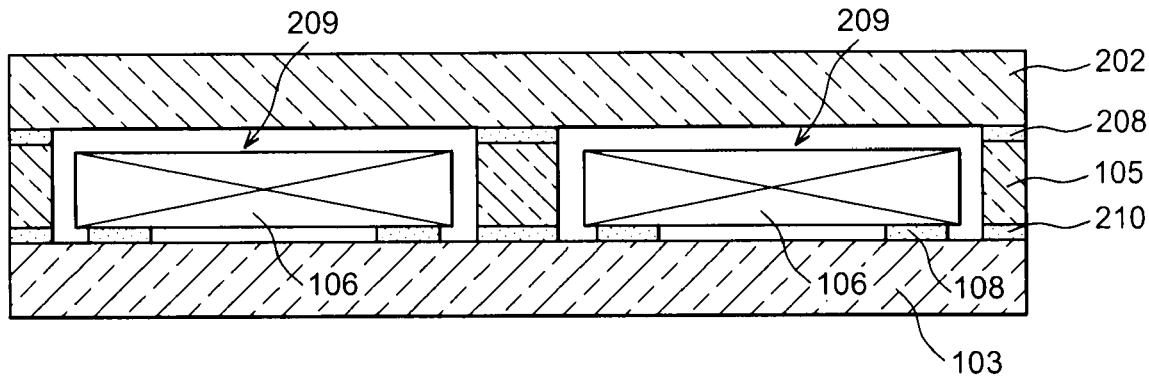
Figure 8G:
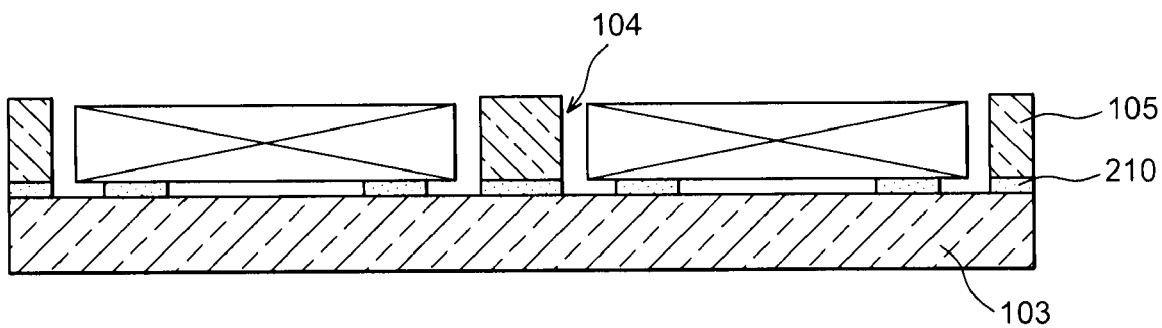

Assembling both previously made parts of the protective structure 100 is performed, for example by adhesive bonding such as organic bonding by epoxy 210 (FIG. 8F).

Finally, total thinning of the layer 202 and suppression of the remaining portions of the SiO$_2$ layer 208 is achieved, whereby a protective structure 100 similar to the one illustrated in FIG. 1C may be obtained.

In order to obtain protective structures in which the optical components 106 are fitted to the dimensions of the holes 104, and the holes 104 of which have optical apertures to the imagers 12 of lesser dimensions than those of the optical elements 106, as in the examples illustrated in FIGS. 7A-7C, it is possible not to achieve total thinning of the layer 202. After the adhesive bonding step illustrated in FIG. 8F, partial thinning of the layer 202 and then lithography and local etching of the layer 202 may then be performed, in order to make apertures in the layer 202 at the optical elements 106.

Reference is now made to FIGS. 9A-9F which illustrate the steps of an alternative embodiment of the protective structure 100 of an optical device 1000.

First of all, a structure is made, similar to the one illustrated in FIG. 8E including the layer 202, the second structured layer 105 and the dielectric portions 208 (or the dielectric layers 206 and/or 208 when the dielectric is not etched). This structure is for example made similarly to the method described earlier by applying the steps described in connection with FIGS. 8C-8E. The layer 202 is intended here to form the first layer 103 of the protective structure 100.

The exemplary embodiments described here include adhesive bonding interfaces of structured optical elements such that no bonding interface is in the optical field of the optical elements 106. However, during the method for making the protective structure 100, it is possible to have portions of adhesive present in the optical field of the elements 106, these portions being kept until the end of the method, even after opening the optical field of the elements 106 insofar that these portions have adequate optical properties, or else etched during the method, after opening the optical field of the elements 106. It is therefore possible to keep the dielectric and/or the adhesive bonding interfaces in the optical field of the elements 106. If, however, the dielectric degrades the optical performances, the dielectric and/or the adhesive bonding interfaces may be removed upon making the protective structure or optionally at the end of the method for making the optical device 1000, upon opening the protective structure at the optical field of the optical elements 106.

Figure 9A:
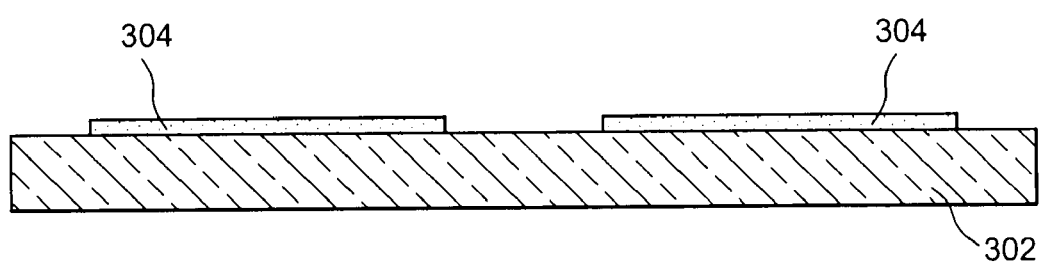

As illustrated in FIG. 9A, deposition of photosensitive resin portions 304 is performed on a layer 302 comprising glass or semiconductor. These portions of photosensitive resin 304 are deposited at the future locations of the optical elements 106.

Figure 9B:
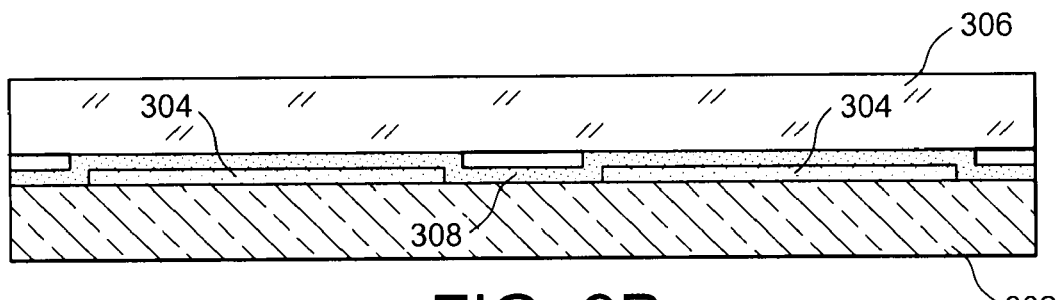
Figure 9C:
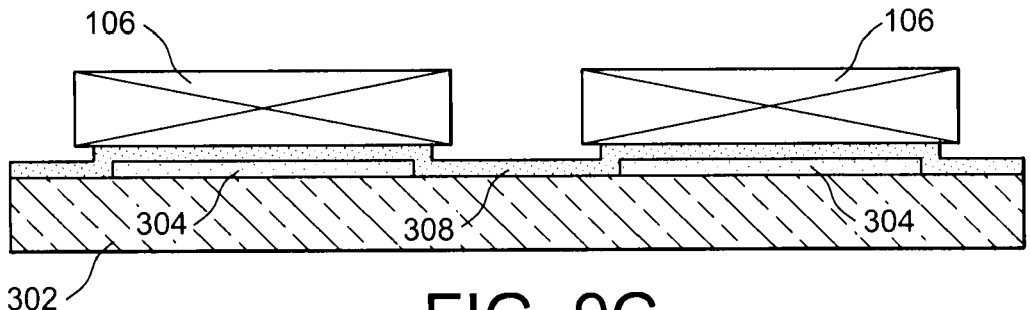

Temporary adhesive bonding of a second layer comprising glass 306 is then achieved, layer from which optical elements 106 will be made, via an adhesive bonding interface 308, on the first layer 302 and on the resin portions 304 (FIG. 9B). The second glass layer 306 is then cut out in order to form the optical elements 106 (FIG. 9C).

Figure 9D:
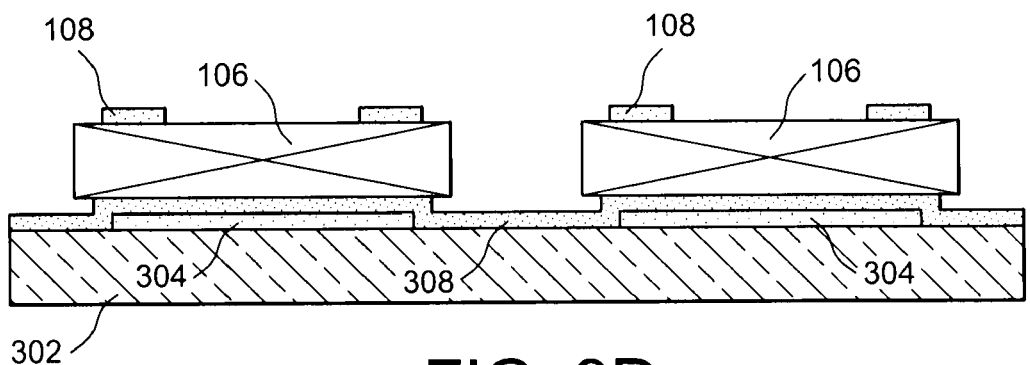

Portions of photosensitive resin (laminated dry film for example) are deposited on the optical elements 106, forming portions of interfaces 108 (FIG. 9D). With these resin portions, it will subsequently be possible to achieve organic bonding of the optical elements 106. It is also possible to deposit these interface portions by screen-printing.

Figure 9E:
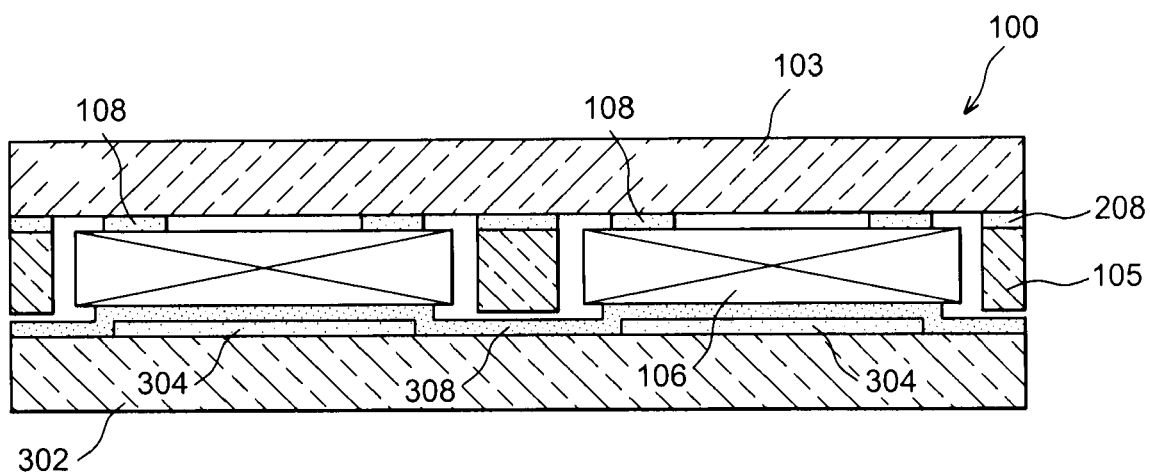

In FIG. 9E, the assembling is then performed between the two structures previously made, via interface portions 108 and the first layer 103, in the recesses formed in the second layer 105.

Figure 9F:
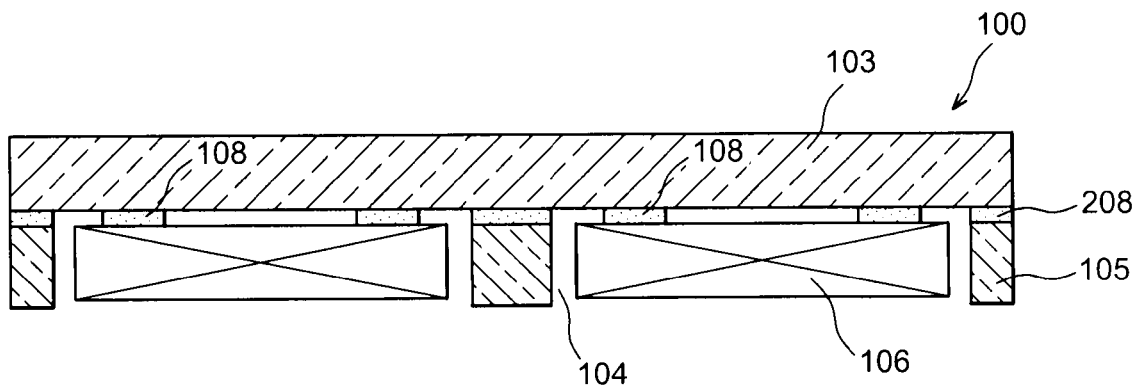

Finally, in FIG. 9F, the layer 302, the resin portions 304 and the temporary bonding layer 308 are removed, whereby the structure 100 may be obtained.

Because of the protective structure used, it is possible that this structure also achieves protection of the imagers from parasitic light, i.e. light located out of the optical field of the imagers, and/or from electromagnetic perturbations related to the operating environment of the optical device 1000 including the imagers (for example in a portable telephone).

A method for making an optical device including such a protective structure will now be described in connection with FIGS. 10A-10K.

A structure similar to the one illustrated in FIG. 8E including the layer 202, the second structured layer 105 and the dielectric portions 208 is first of all made, in order to form a first part of the structure 100. This structure is for example made similarly to the first embodiment, by applying the steps described in connection with FIGS. 8C-8E. Here, the layer 202 is intended to form the first layer 103 of the protective structure 100.

Figure 10A:
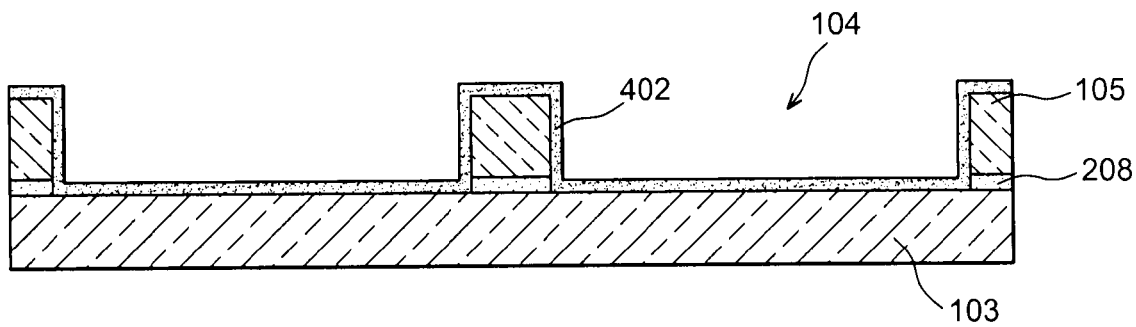

As illustrated in FIG. 10A, one or more layers 402 are then deposited on the face of the structure made previously having the holes 104, thereby covering the portions of the second layer 105 and the face of the first layer 103 forming the bottom walls of the holes 104. The layer 402 may be opaque or at least partly opaque in the range of the wavelengths of the imagers intended to be protected by this structure 100 and/or electrically conducting. It is also possible to achieve deposition of a first opaque layer 402 and deposition of a second electrically conducting layer 402 on the first opaque layer 402 or vice versa.

The steps described earlier in connection with FIGS. 9A-9D are then applied in order to form a second part of the structure 100 including the layer 302, the resin portions 304, the adhesive bonding interface 308, the optical elements 106 and the interface portions 108.

Figure 10B:
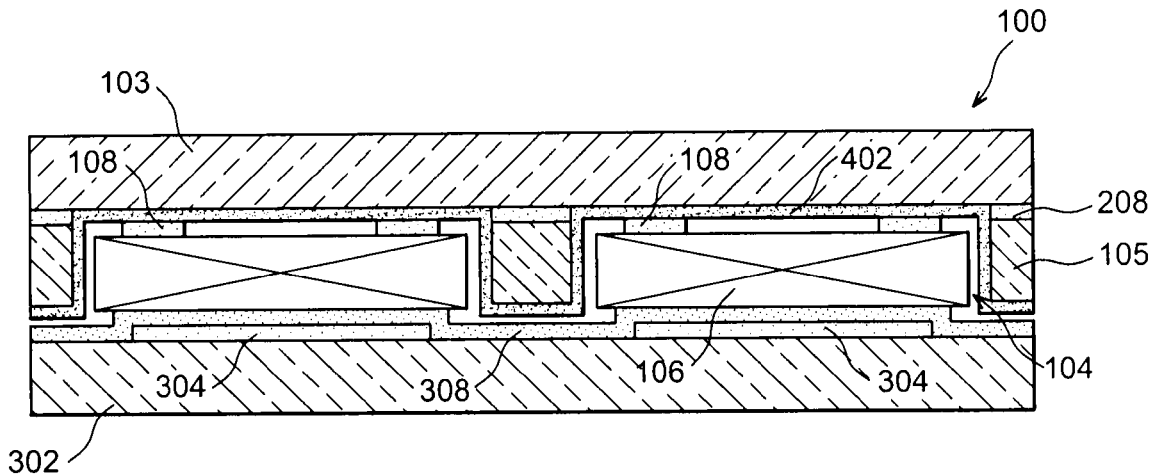
Figure 10C:
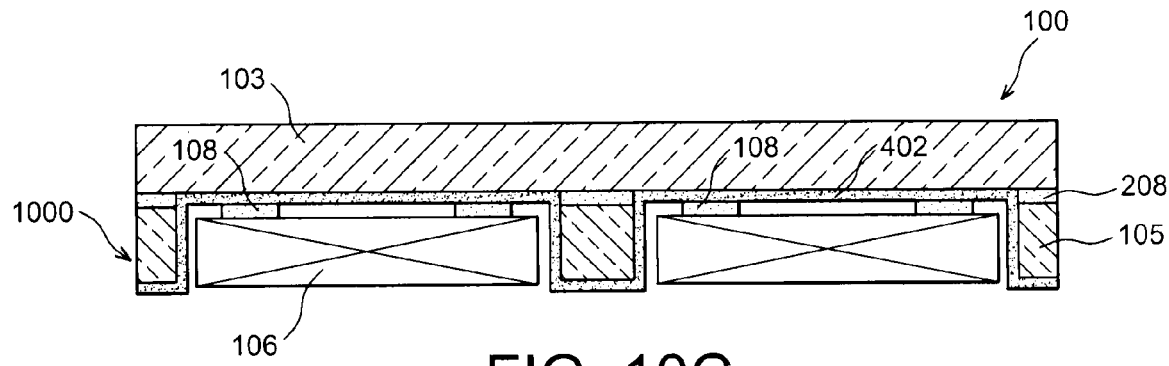

In FIG. 10B, assembly is then achieved between the two structures made earlier, via the interface portions 108 and the first layer 103, in the holes 104. In FIG. 10C, the substrate 302, the resin portions 304 and the temporary adhesive bonding layer 308 are removed, whereby the structure 100 may be obtained.

Figure 10D:
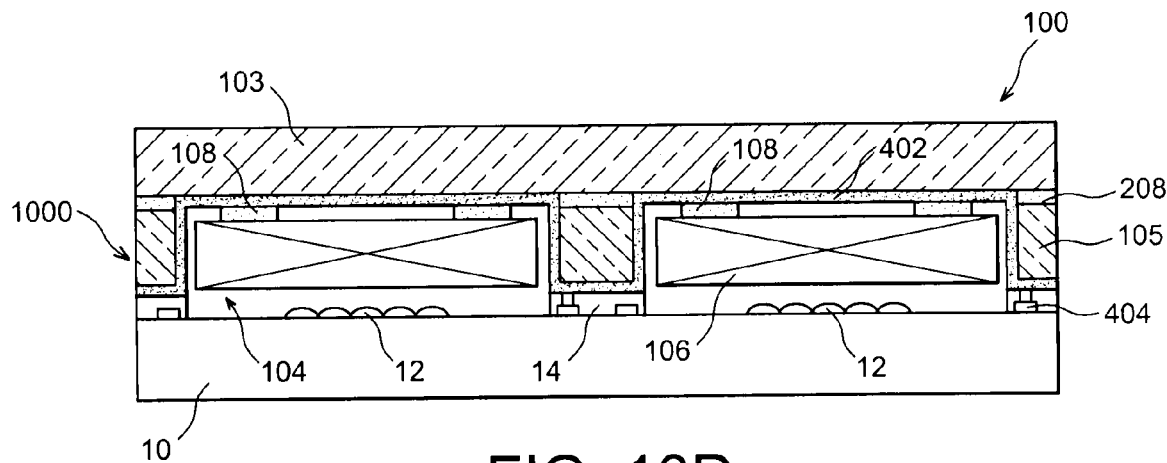

As illustrated in FIG. 10D, assembly is then achieved between the protective structure 100 made previously and the substrate 10 including integrated imagers 12 in order to form the optical device 1000. In this exemplary embodiment, portions of opaque organic adhesive 14 are used in order to achieve this assembling (electrically insulating adhesive). Prior to this assembling, contacts 404 were made on the substrate 10 at the adhesive portions 14, so as to have at least one contact 404 per imager 12.

Figure 10E:
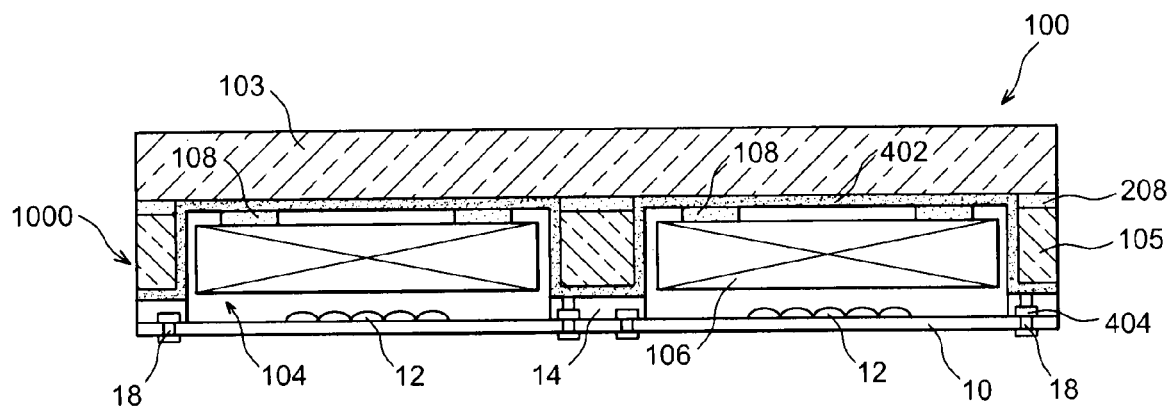

In FIG. 10E, thinning of the substrate 10 is then performed and interconnections 18 are then formed in the substrate 10, a part of which is connected to the contacts 404. With these interconnections 18 connected to the contacts 404, ground take-up may be achieved on the rear face of the device 1000.

Figure 10F:
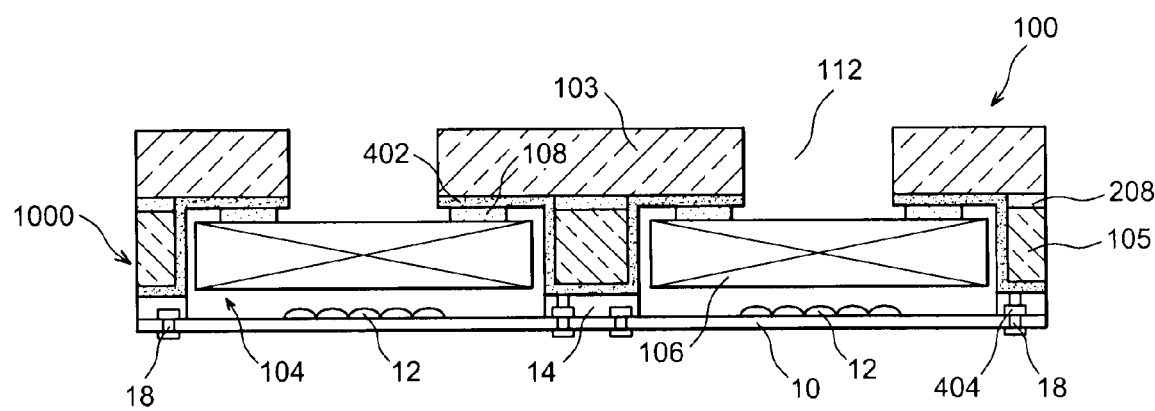

Apertures 112 are then made in the first layer 103 in order to clear the optical field of the imagers 106 (FIG. 10F).

Figure 10G:
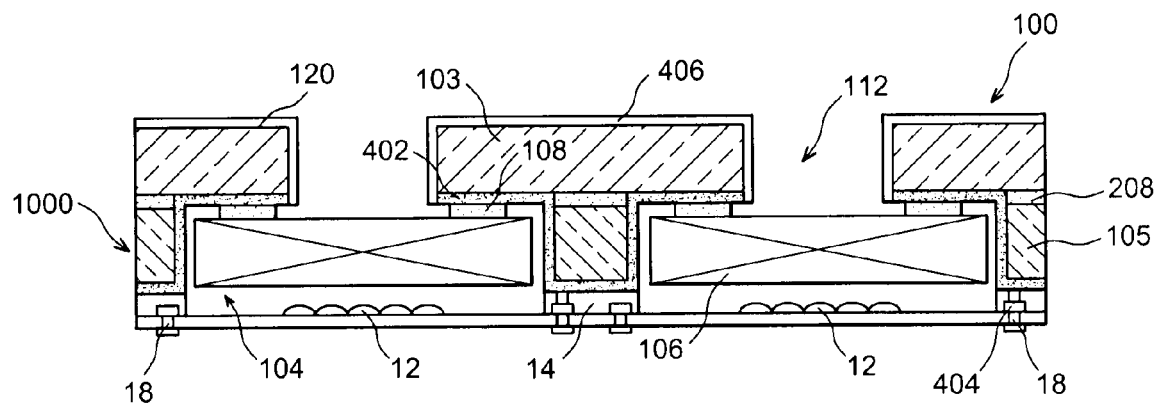

As illustrated in FIG. 10G, one or more layers 406 are then deposited on the walls of the layer 103. The layer 406 may be opaque in the range of the wavelengths of the imagers intended to be protected by this structure 100 and/or electrically conducting. It is also possible to achieve deposition of a first opaque layer 406 and deposition of a second electrically conducting layer 406 on the first opaque layer 406 or vice versa.

Figure 10H:
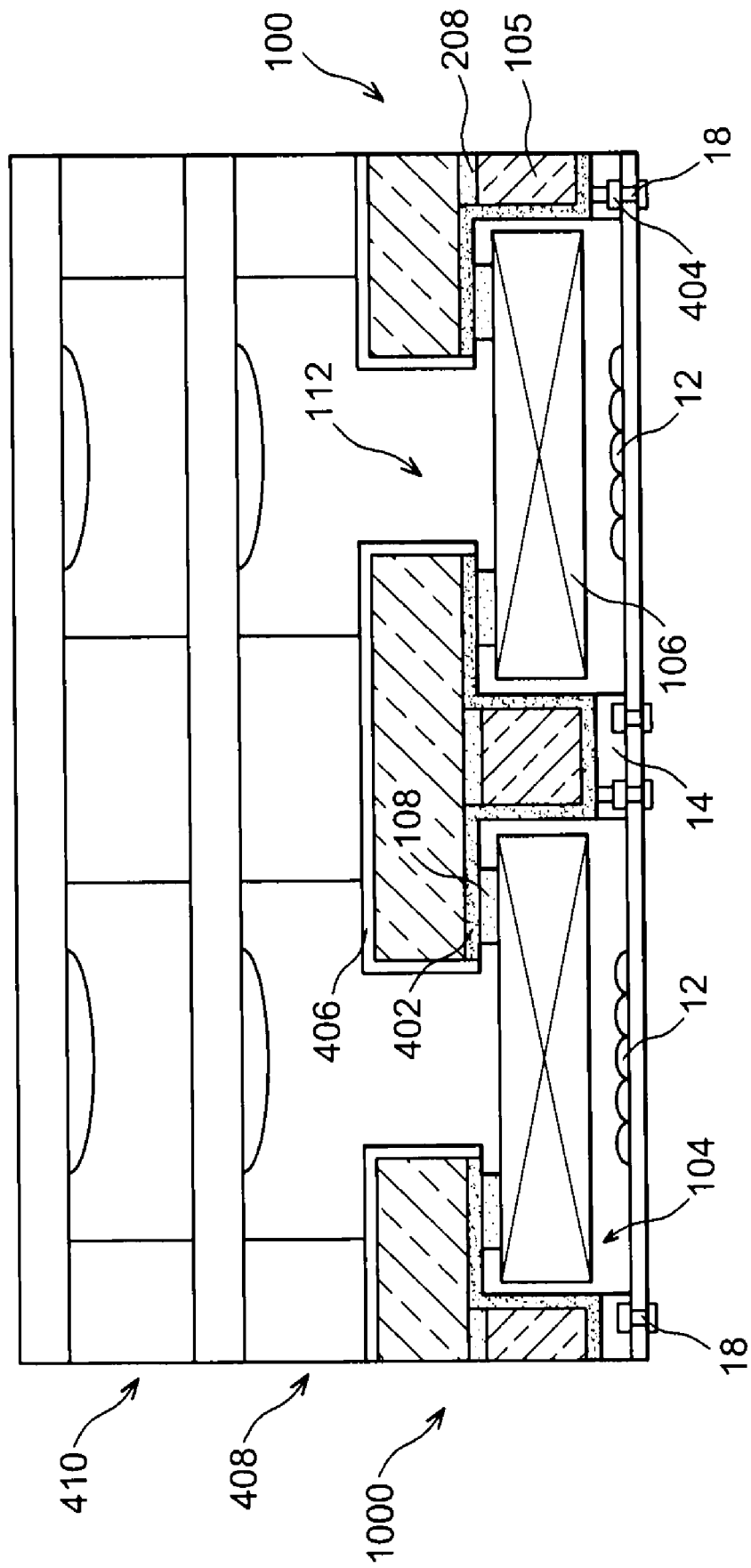

Finally, additional optical levels may be achieved, as illustrated in FIG. 10H, in which two other levels 408 and 410 are illustrated, each level including optical elements (lenses, plates with parallel faces, etc.) positioned in the optical field of the imagers 12.

Figure 10I:
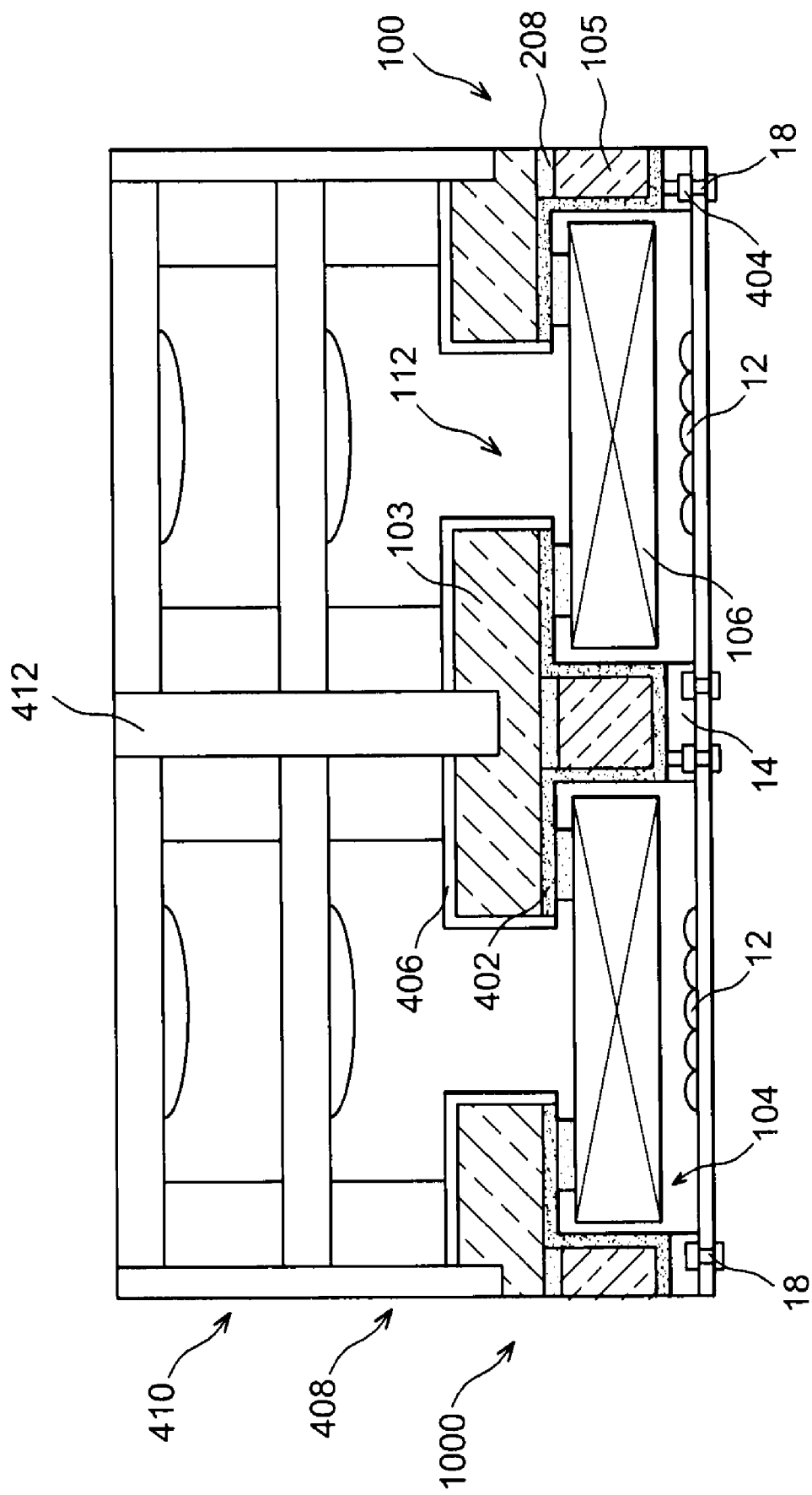
Figure 10J:
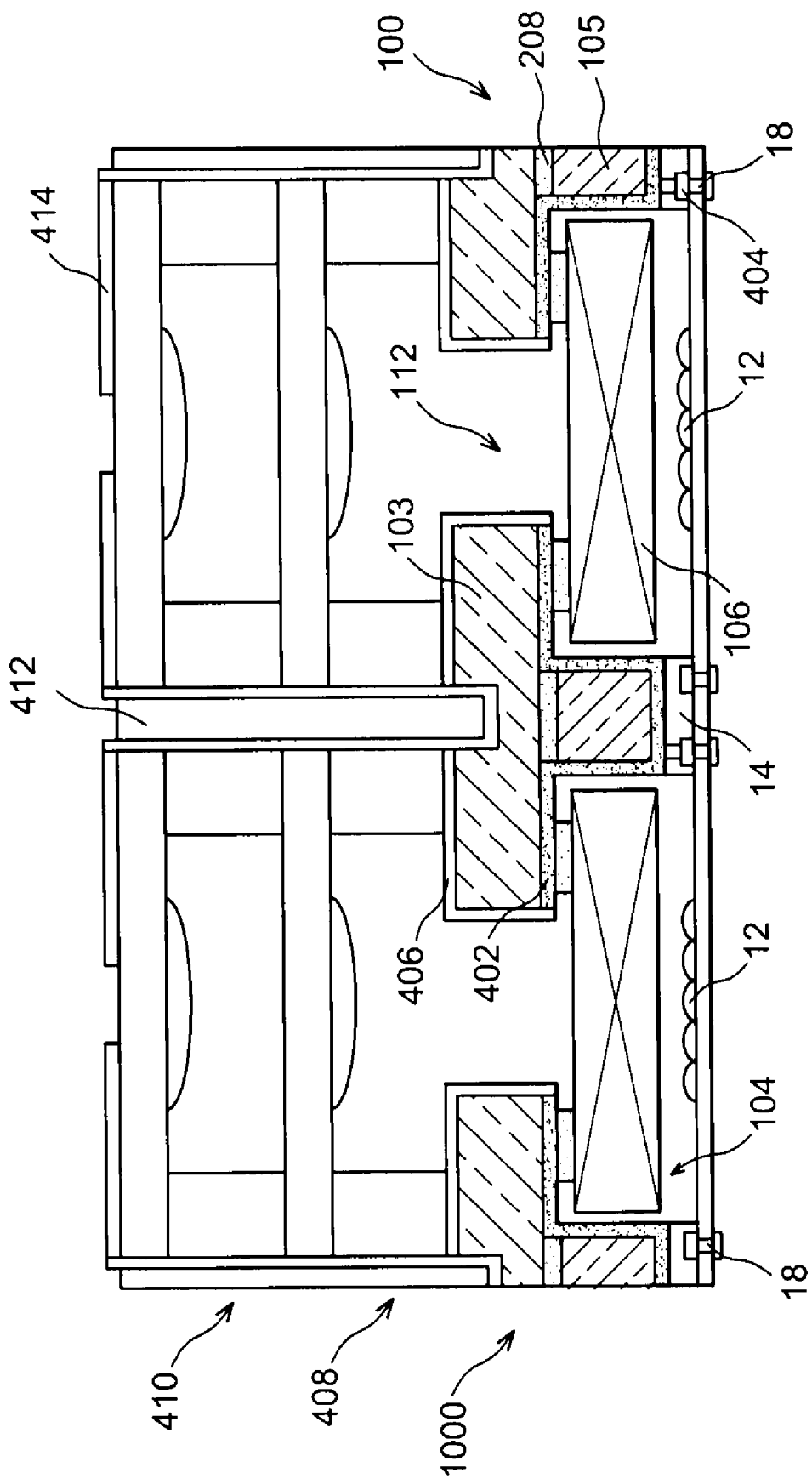
Figure 10K:
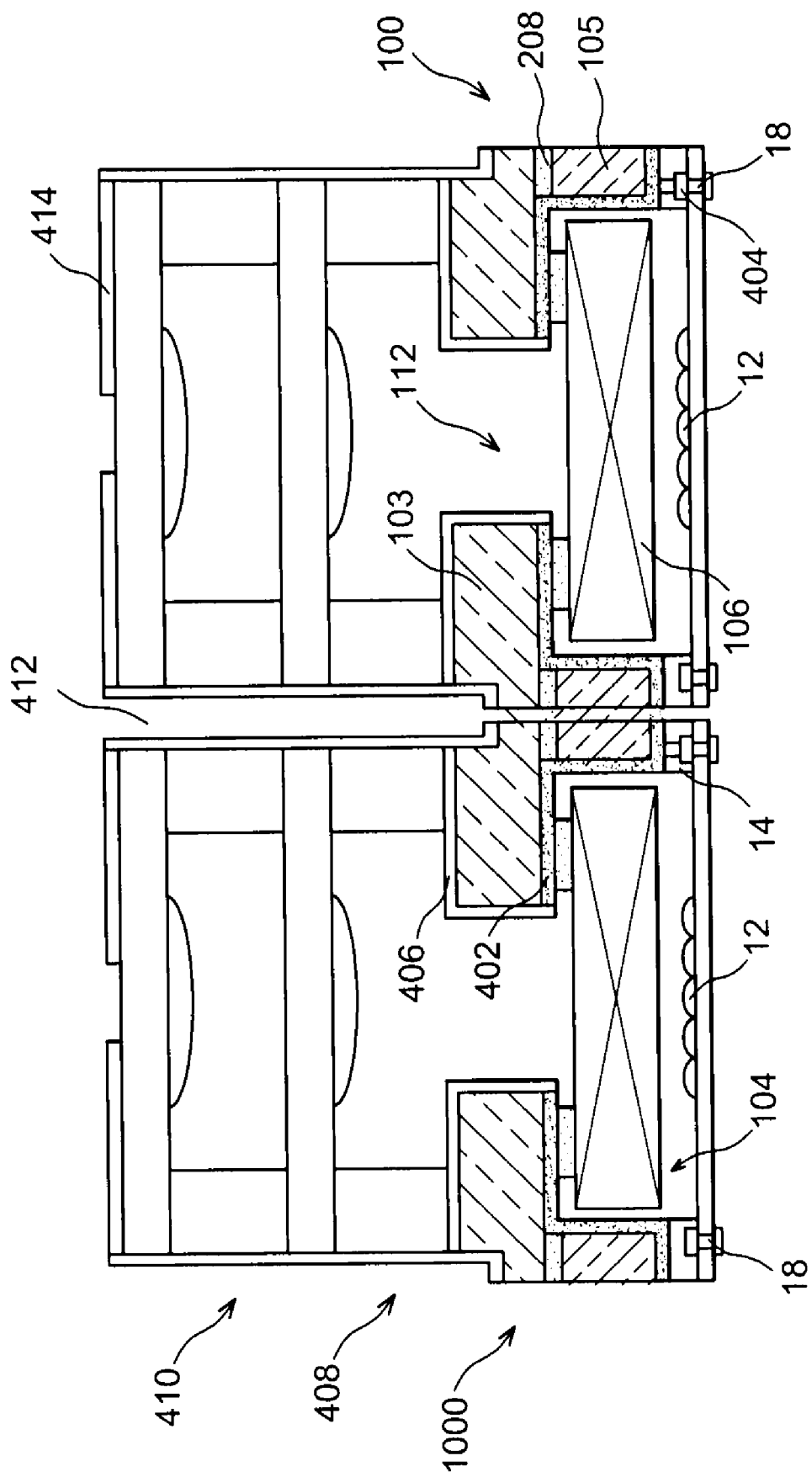

In FIG. 10I, partial cutting-out of the device 1000 is performed, forming trenches 412 completely crossing the additional optical levels 408, 410, but only partly crossing the first layer 103, so that the other intact elements of the device 1000 may guarantee the mechanical strength of the device 1000.

An opaque metal deposit 414 is then made on the device 1000 and notably on the walls of the trenches 412, with which the aperture of the device 1000 may be defined at the optical field and electric contact with the layer 106 may be resumed.

The method is then completed by making interconnection beads 17 under each imager 12 and by singulation of each portion of the device 1000 including at least one imager 12 (FIG. 10K) in order to form different camera modules.

With the device 1000 made according to the method described in connection with FIGS. 10A-10K, mechanical strength may be guaranteed even after partial cutting-out of the device 1000, while providing optical and electromagnetic protection to the imagers 12. This described protective function may also be provided by the structure proposed in the case when interconnections are made between the structure and the imager substrate.

The geometry of the optical elements 106 is not necessarily similar to that of the imagers 12 at their pixel planes, which for example is of a rectangular shape. The optical elements 106 may be of rectangular shape or of any other shape (square, circular, etc.) and/or have a form factor similar to or different from that of the imagers.

Of course, many alternative embodiments may be applied. In particular, all the embodiments of the cavities in a support may be used within the scope of the invention. Mention may notably be made of the method of the DBG type in which precutting before transfer and then thinning are achieved in order to obtain blind cavities.

The invention claimed is:

1. A method for making an optical device with integrated optoelectronic components, comprising:
   a) making a protective structure comprising at least one support in which at least one blind hole is made in the at least one support, at least one optical element being positioned in the blind hole and attached to at least one surface of the blind hole;
   b) then attaching a face of the support to a substrate comprising the integrated optoelectronic components, the blind hole forming a cavity in which the at least one optical element faces one of the optoelectronic components;
   c) then performing thinning of the substrate and making electric connections through the substrate; and
   d) then making at least one aperture through the protective structure and a bottom surface of the blind hole, uncovering at least one portion of an optical field of the at least one optical element.

2. The method according to claim 1, wherein the making electric connections in the step c) includes making the electric connections through the substrate and the support.

3. The method according to claim 1, wherein the at least one optical element comprises at least one of: glass, an organic material, or germanium.

4. The method according to claim 1, wherein the at least one optical element includes at least one of: a plate with parallel faces, a lens, or a lens having an index gradient.

5. The method according to claim 1, wherein the support includes a planar rear face, opposite to a face attached to the substrate.

6. The method according to claim 1, wherein the integrated optoelectronic components include at least one of CMOS or CCD imagers.

7. The method according to claim 1, wherein the support comprises a material having a heat expansion coefficient similar to that of a material of the substrate.

8. The method according to claim 1, wherein, during the attaching the support to the substrate in the step b), the support is attached to the substrate via spacer elements.

9. The method according to claim 1, further comprising thinning the support.

10. The method according to claim 1, wherein the making the protective structure in the step a) comprises:
    making a first stack including a first mechanical layer and a second layer that comprises at least one material forming the at least one optical element;
    etching the second layer, wherein at least one remaining portion of the second layer forms the at least one optical element;
    making a second stack including a third layer and a fourth layer;
    etching at least one hole through the fourth layer;
    attaching the first and second stacks, wherein remaining portions of the fourth layer are positioned against a face of the first layer and wherein the at least one optical element is positioned in the hole etched through the fourth layer; and
    removing the third layer.

11. The method according to claim 10, wherein the removing the third layer includes totally thinning the third layer or disassembling the third layer, wherein the dissembling occurs when the third layer is attached by a temporary adhesive bonding to the fourth layer.

12. The method according to claim 1, wherein the making the protective structure in the step a) comprises:
    making a first stack including a first layer and a second layer that comprises at least one material forming the at least one optical element;
    etching the second layer, wherein at least one remaining portion of the second layer forms the at least one optical element;
    depositing an adhesive bonding interface on at least the at least one optical element;
    making a second stack including a third mechanical layer and a fourth layer;
    etching at least one hole through the fourth layer;
    attaching the first and second stacks, wherein the third layer is positioned against the adhesive bonding interface and wherein the at least one optical element is positioned in the hole etched through the fourth layer; and
    removing the first layer.

13. The method according to claim 1, wherein the making the protective structure in step a) comprises:
    making the support in which the blind hole is made; and
    positioning and attaching the at least one optical element in the blind hole via at least one attachment material positioned beforehand at least on one surface of the blind hole or on the at least one optical element.

14. The method according to claim 1, further comprising depositing at least one layer, which is at least partly opaque in a range of operating wavelengths of the optoelectronic component or which is electrically conducting, on at least one part of the surfaces of the blind hole.

15. The method according to claim 14, wherein the at least one layer is deposited at least on a part of the face of the support attached to the substrate.

16. The method according to claim 1, further comprising, during the step a), making at least one of an optical or electromagnetic protection between the support and the at least one optical element.

17. The method according to claim 1, wherein the support is formed from a single layer, and the blind hole is obtained by etching in the single layer.

18. The method according to claim 1, further comprising, after the making the at least one aperture in the step d), depositing at least one layer that is at least partly opaque in a range of operating wavelengths of the optoelectronic component or that is electrically conducting on a wall of the aperture or on a rear of the support, opposite to the face of the support attached to the substrate.

19. The method according to claim 1, further comprising, after the making the at least one aperture in the step d), adding at least one optical stack to a rear face of the support, opposite to the face of the support attached to the substrate.

20. The method according to claim 19, further comprising, after the adding the optical stack, making electric connections to the optoelectronic components, or, wherein the optical stack includes plural optical elements, making electric connections to the plural optical elements.

21. The method according to claim 19, further comprising making an optical or electromagnetic protection on the at least one optical stack.

22. The method according to claim 21, further comprising, after making the optical or electromagnetic protection, making at least one aperture through the optical or electromagnetic protection.

23. The method according to claim 19, further comprising making an optical and electromagnetic protection on the at least one optical stack.

24. The method according to claim 23, further comprising, after making the optical and electromagnetic protection, making at least one aperture through the optical and electromagnetic protection.

25. The method according to claim 19, wherein the protective structure includes plural optical elements, and further comprising making electric connections to the plural optical elements.

26. The method according to claim 1, wherein the performing thinning in the step c) includes thinning the support.

27. The method according to claim 1, wherein the making electric connections in the step c) further includes making the electric connections between the substrate and the support.

28. The method according to claim 1, further comprising depositing a layer which is partly opaque in a range of operating wavelengths of the optoelectronic component and a layer which is electrically conducting on at least one part of the surfaces of the blind hole.

29. The method according to claim 28, wherein the layer which is partly opaque in the range of operating wavelengths of the optoelectronic component and the layer which is electrically conducting are deposited at least on a part of the face of the support attached to the substrate.

30. The method according to claim 1, further comprising, during the step a), making an optical and electromagnetic protection between the support and the at least one optical element.

31. The method according to claim 1, further comprising, after the making the at least one aperture in the step d), depositing a layer that is at least partly opaque in a range of operating wavelengths of the optoelectronic component and a layer that is electrically conducting on a wall of the aperture or on a rear support, opposite to the face of the support attached to the substrate.

32. The method according to claim 1, further comprising depositing at least one layer, which is at least partly opaque in a range of operating wavelengths of the optoelectronic component or which is electrically conducting, at least on a part of the face of the support attached to the substrate.

33. The method according to claim 1, further comprising depositing a layer which is partly opaque in a range of operating wavelengths of the optoelectronic component and a layer which is electrically conducting at least on a part of the face of the support attached to the substrate.

* * * * *